(12) United States Patent
Dechene et al.

(10) Patent No.: US 9,252,022 B1
(45) Date of Patent: Feb. 2, 2016

(54) PATTERNING ASSIST FEATURE TO MITIGATE REACTIVE ION ETCH MICROLOADING EFFECT

(71) Applicant: International Business Machines Corporation, Armonk, NY (US)

(72) Inventors: Daniel J. Dechene, Wappingers Falls, NY (US); Geng Han, Fishkill, NY (US); Scott M. Mansfield, Hopewell Junction, NY (US); Stuart A. Sieg, Albany, NY (US); Yunpeng Yin, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/533,629

(22) Filed: Nov. 5, 2014

(51) Int. Cl.
*H01L 21/8234* (2006.01)
*H01L 21/308* (2006.01)
*H01L 21/3065* (2006.01)
*H01L 29/66* (2006.01)

(52) U.S. Cl.
CPC ........ *H01L 21/3086* (2013.01); *H01L 21/3065* (2013.01); *H01L 21/823431* (2013.01); *H01L 29/6681* (2013.01); *H01L 29/66795* (2013.01)

(58) Field of Classification Search
CPC .................. H01L 21/02296; H01L 21/02345; H01L 21/8232
See application file for complete search history.

(56) References Cited

U.S. PATENT DOCUMENTS

| 8,099,684 | B2 | 1/2012 | Meiring et al. | |
| 8,158,334 | B2 | 4/2012 | Gabor et al. | |
| 2011/0091815 | A1 | 4/2011 | Dunn et al. | |
| 2013/0330889 | A1* | 12/2013 | Yin | H01L 21/823821 438/197 |

* cited by examiner

*Primary Examiner* — Cheung Lee
(74) *Attorney, Agent, or Firm* — Cantor Colburn LLP

(57) ABSTRACT

A method of fabricating a semiconductor device includes forming a masking layer on an upper surface of a semiconductor substrate. The masking layer is patterned to form at least one masking element that designates an active region of the semiconductor substrate and at least one patterning assist feature adjacent the at least one masking element. An etching process is performed to form a plurality of semiconductor fins on the semiconductor substrate. The plurality of semiconductor fins include at least one isolated fin formed on the active region according to the at least one masking element and at least one sacrificial fin formed according to the patterning assist feature that reduces a loading effect that occurs during the etching process.

19 Claims, 35 Drawing Sheets

PATTERNING ASSIST FEATURE TO MITIGATE REACTIVE ION ETCH MICROLOADING EFFECT

BACKGROUND

The present invention relates to semiconductor fabrication, and more specifically, to reducing the microloading effect realized by a semiconductor device during a reactive ion etching (RIE) process.

The etch rate of silicon during reactive ion etching (RIE) can be affected by local variations in the pattern density, which in turn causes local variations in the etch rate. The local depletion of reactive species that cause the local variations in the pattern density and is typically referred to as the RIE microloading effect.

SUMMARY

According to an exemplary embodiment, a method of fabricating a semiconductor device includes forming a masking layer on an upper surface of a semiconductor substrate. The masking layer is patterned to form at least one masking element that designates an active region of the semiconductor substrate and at least one patterning assist feature adjacent the at least one masking element. An etching process is performed to form a plurality of semiconductor fins on the semiconductor substrate. The plurality of semiconductor fins include at least one isolated fin formed on the active region according to the at least one masking element and at least one sacrificial fin formed according to the patterning assist feature that reduces a loading effect that occurs during the etching process.

In another exemplary embodiment, a method of fabricating a semiconductor device includes forming a plurality of semiconductor fins on an upper surface of a semiconductor substrate. The plurality of fins include at least one isolated fin and at least one sacrificial fin. A cut mask is formed on the upper surface of the semiconductor substrate to cover the plurality of fins, and the cut mask is patterned to expose the at least one sacrificial fin. The method further includes performing a first sacrificial cutting process to remove the at least one sacrificial fin and to form a void on the upper surface of the substrate while maintaining the at least one isolated fin. The method further includes forming a patterning assist feature in the void such that the combination of the patterning assist feature and the at least one isolated fins defines a dense array pattern. The method further includes performing an etching process to transfer the dense array pattern into the semiconductor substrate such that the at least one patterning assist feature reduces the loading effect realized by the at least one isolated fin during the etching process.

In yet another exemplary embodiment, a method of fabricating a semiconductor device comprises forming a plurality of semiconductor fins on an upper surface of a semiconductor substrate. The plurality of fins extend along a first direction to define a length. The method further includes forming a gate stack on the plurality of semiconductor fins. The gate stack extends in the first direction to define a gate length and a second distance opposite the first direction to define a gate width. The method further includes identifying a gate extension portion located adjacent the plurality of semiconductor fins to receive an extended portion of the gate stack. The method further includes forming a cutting pattern in the gate extension portion and on the extend portion of the gate stack, and forming a semiconductor assist structure adjacent an isolated semiconductor included with the plurality of semiconductor fins.

Additional features and utilities are realized through the techniques of the present teachings. Other exemplary embodiments and features of the teachings are described in detail herein and are considered a part of the claimed teachings. For a more detailed description of the teachings and features, drawings and descriptions of the exemplary embodiments are presented below.

BRIEF DESCRIPTION OF THE SEVERAL VIEWS OF THE DRAWINGS

The subject matter describing exemplary embodiments of the teachings is particularly pointed out and distinctly claimed in the claims at the conclusion of the specification. The forgoing and other features, and utilities of the teachings are apparent from the following detailed description taken in conjunction with the accompanying drawings in which:

FIGS. 1A-9B are a series of views illustrating a method of forming a finFET device using patterning assist features according to an exemplary embodiment, in which:

FIG. 1A is a top view illustrating a semiconductor device including a hardmask layer formed on an upper surface of the semiconductor device;

FIG. 9B is a cross-sectional view of the semiconductor device of FIG. 9A taken along line A-A';

FIGS. 10-15 are a series of views illustrating masking patterns for forming patterning assist features according to an exemplary embodiment, in which:

FIG. 10 is a top view of a semiconductor device including a plurality of active semiconductor regions formed on an upper surface thereof;

FIG. 11 illustrates the semiconductor device of FIG. 10 showing masking element patterns and printing assist feature patterns covering respective active semiconductor regions;

FIG. 12 illustrates the semiconductor device of FIG. 11 following an etching process that removes exposed portions of the active semiconductor regions;

FIG. 13 illustrates the semiconductor device of FIG. 12 showing a cut mask pattern covering respective active semiconductor regions;

FIG. 14 illustrates the semiconductor device of FIG. 13 following a cutting process that removes the portions of the active semiconductor regions according to the cut mask pattern; and FIG. 15 shows all the masking patterns used to form the final semiconductor device illustrated in FIG. 14.

FIGS. 16A-23B are a series of views illustrating a method of forming a finFET device using patterning assist features according to another exemplary embodiment, in which:

FIG. 16A is a top view illustrating a hardmask layer formed on an upper surface of a semiconductor device;

FIG. 23B is a cross-sectional view of the semiconductor device shown in FIG. 23A taken along lines A-A'.

FIGS. 24-29 are a series of views illustrating masking patterns for forming patterning assist features according to another exemplary embodiment, in which:

FIG. 24 is a top view of a semiconductor device having a plurality of active semiconductor regions formed on an upper surface thereof;

FIG. 25 illustrates the semiconductor device of FIG. 24 showing a cut mask pattern covering respective active semiconductor regions;

FIG. 26 illustrates the semiconductor device of 25 following a cutting process that cuts portions of the active semiconductor regions according to the cut mask pattern to form respective voids;

FIG. 27 illustrates the semiconductor device of FIG. 26 showing masking element patterns covering selected active semiconductor regions for forming respective masking elements thereon, and showing patterning assist feature patterns covering the voids for forming patterning assist features in the voids;

FIG. 28 illustrates the semiconductor device of FIG. 27 following a cutting process that removes exposed portions of the active semiconductor regions; and FIG. 29 shows all the masking patterns used to form the final semiconductor device illustrated in FIG. 28.

FIGS. 30-34 are a series of views illustrating masking patterns for forming patterning assist features according to yet another exemplary embodiment illustrated, in which:

FIG. 30 shows a final device fabricated when excluding a cut mask in the gate extension area such that a gate structure occupies the gate extension area;

FIG. 31 illustrates a top view of a semiconductor device including a plurality of active semiconductor regions, a masking element formed on the semiconductor regions, and a single gate structure including an extended portion that extends into a gate extension area before undergoing a cutting process according to a non-limiting embodiment;

FIG. 32 illustrates the semiconductor device of FIG. 31 after forming a first cut mask formed between first and second semiconductor devices and a second cut mask formed at the gate extension area and covering a portion of the single gate structure extending into the gate extension area according to a non-limiting embodiment;

FIG. 33 illustrates a final semiconductor device following a cutting process according to the cutting masks that separates the single gate structure into multiple individual gate structures and that cuts away portion of the individual gate structure extending into the gate extension area according to a non-limiting embodiment;

FIG. 34 illustrates forming an additional semiconductor assist structure adjacent to an isolated fin of the initial semiconductor structure according to another non-limiting embodiment.

DETAILED DESCRIPTION

A series of views shown in FIGS. 1A-9B illustrate a process flow for forming a finFET device using patterning assist features according to an exemplary embodiment. The patterning assist features reduce the micro loading effect realized by one or more semiconductor fins during an etching process such as, for example a reactive ion etching (RIE) process, when forming a desired isolated semiconductor device.

Figure 1A:
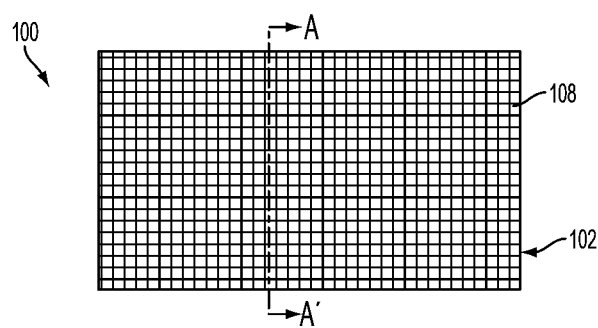
Figure 1B:
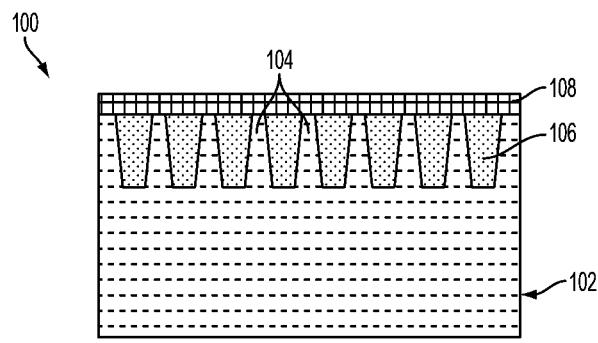
FIG. 1B is a cross-sectional view of the semiconductor device of FIG. 1A taken along the lines A-A'.

Referring now to FIGS. 1A-1B, a semiconductor device 100 is illustrated according to an exemplary embodiment. The semiconductor device 100 includes a semiconductor substrate 102 having a plurality of active semiconductor regions 104, an oxide material 106 deposited between the active semiconductor regions 104, and a hardmask layer 108 formed on an upper surface of the active semiconductor regions 104 and the oxide material 106. The semiconductor substrate 102 may be formed from, for example, silicon (Si). Although a bulk semiconductor substrate 102 is illustrated, it is appreciated that the semiconductor substrate 102 may be formed as a semiconductor-on-insulator (SOI) substrate as understood by one of ordinary skill in the art. The oxide material 106 is formed from an oxide material such as, for example, silicon dioxide ($SiO_2$). The hardmask layer 108 is formed from, for example, silicon nitride (SiN).

Figure 2A:
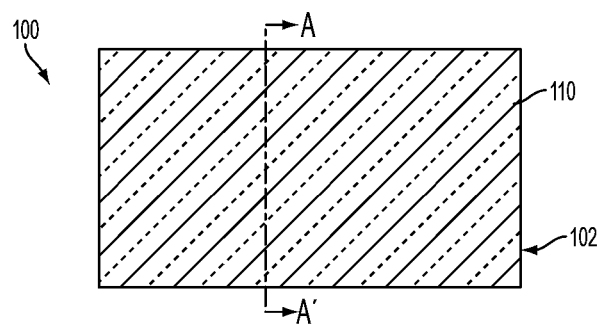
FIG. 2A illustrates the semiconductor device of FIGS. 1A-1B following deposition of a masking layer formed on the hardmask layer.
Figure 2B:
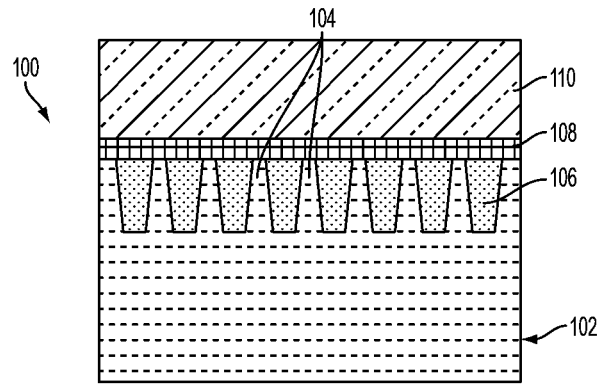
FIG. 2B is a cross-sectional view of the semiconductor device shown in FIG. 2A taken along the line of A-A'.

Referring to FIGS. 2A-2B, a masking layer 110 is formed on an upper surface of the hardmask layer 108. The masking layer 110 may be formed from an organic or inorganic photosensitive material or electron-beam-sensitive material. In cases where the masking layer 110 is formed from a photosensitive material, the masking layer 110 may be sensitive to a deep ultraviolet (DUV) radiation, a mid-ultraviolet (MUV) radiation, or an extreme ultraviolet (EUV) radiation. In cases where the masking layer 110 is formed from an electron-beam-sensitive material, the masking layer 110 is sensitive to electron beam radiation. The masking layer 110 may comprise a single layer of photoresist, or may include a top anti-reflective-coating (TARC) layer and/or a bottom anti-reflective-coating (BARC) layer. The masking layer 110 may also include any TARC layer or any BARC layer formed therein. According to an embodiment, the masking layer may also include an optical planarization layer (OPL).

Figure 3A:
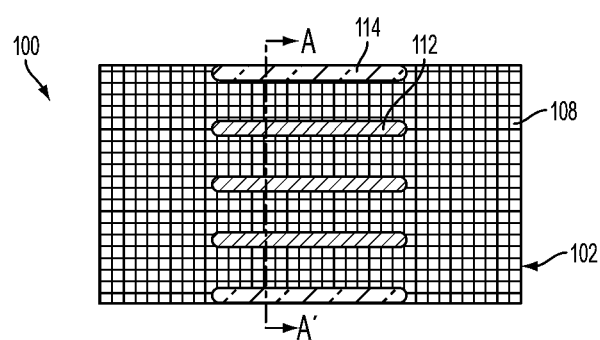
FIG. 3A illustrates the semiconductor device of FIGS. 2A-2B after patterning the masking layer to form masking elements and patterning assist elements on the hardmask layer.
Figure 3B:
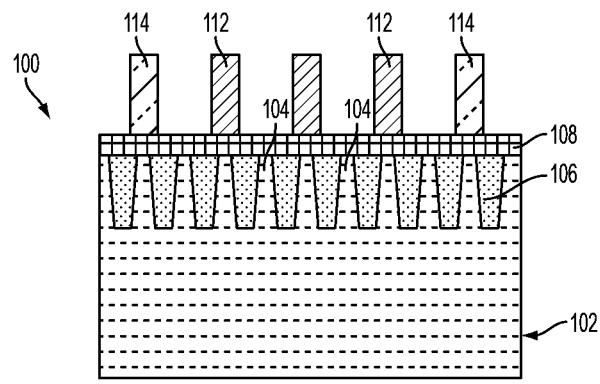
FIG. 3B is a cross-sectional view of the semiconductor device shown in FIG. 3A.

Turning now to FIGS. 3A-3B, the semiconductor device 100 is illustrated after patterning the masking layer 110 according to a well-known lithography process as understood by one of ordinary skill in the art. Accordingly, a plurality of isolated masking elements 112 and a plurality of patterning assist features 114 are formed on an upper surface of the hardmask layer 108 to define a dense array pattern.

Figure 4A:
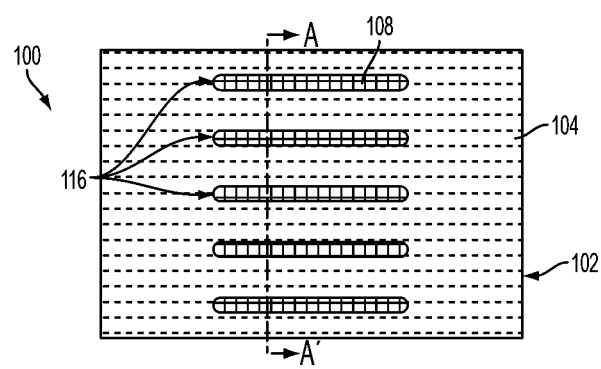
FIG. 4A illustrates the semiconductor device of FIGS. 3A-3B after performing an etching process that forms a plurality of semiconductor fins in the semiconductor device.
Figure 4B:
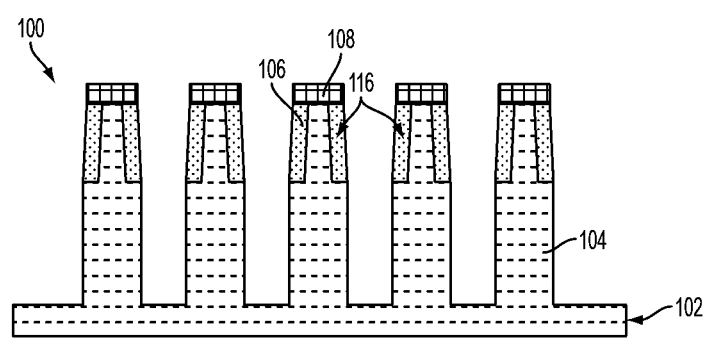
FIG. 4B is a cross-sectional view of the semiconductor device shown in FIG. 4A taken along lines A-A'.

Referring to FIGS. 4A-4B, the semiconductor device 100 is illustrated after performing an etching process that transfers the dense array pattern defined by the masking elements 112 and the patterning assist features 114 into the semiconductor substrate 102. The etching process applied is a RIE process, for example. According to an embodiment, one or more semiconductor device fins 116 are formed in the semiconductor substrate 102 based on the dense array pattern as further illustrated in FIGS. 4A-4B. A remaining portion of the hardmask layer 108 may remain on an upper surface of the semiconductor fins 116. The patterning assist features 114 realize diffusion of reactive neutral species generated by the RIE process such that passivation to the sidewalls of the at least one isolated fin is reduced. Accordingly, the microloading effect realized by the semiconductor fins 116 is reduced.

Figure 5A:
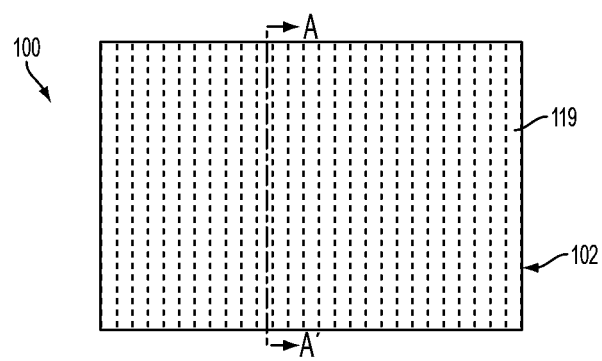
FIG. 5A illustrates the semiconductor device of FIGS. 4A-4B after forming a cut mask on the semiconductor device that covers the semiconductor fins and a pattern layer on an upper surface of the cut mask.
Figure 5B:
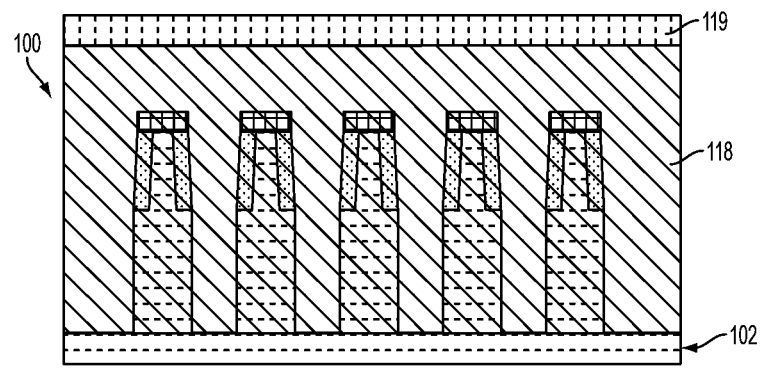
FIG. 5B is a cross-sectional view of the semiconductor device illustrated in FIG. 5A taken along line A-A'.

Referring now to FIGS. 5A-5B, a cut mask 118 is formed on the semiconductor device 100 to cover the semiconductor fins 116, and a patterning layer 119 is formed on an upper surface of the cut mask 118. The cut mask 118 may be formed from various materials including, but not limited to, an organic planarizing layer (OPL), antireflective coating (ARC), and photoresist lithography stack. It is appreciated that the OPL is separate from the patterning stack.

Figure 6A:
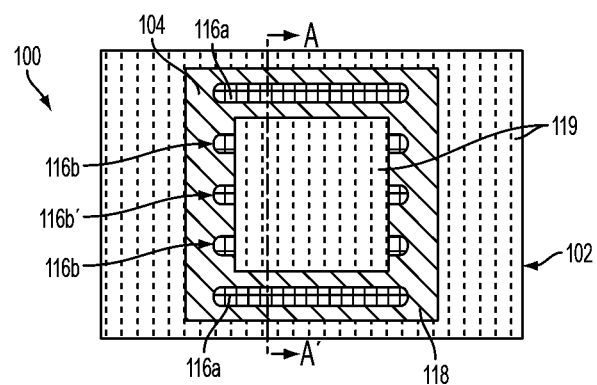
FIG. 6A illustrates the semiconductor device of FIGS. 5A-5B after patterning the patterning layer to expose a portion of the cut mask.
Figure 6B:
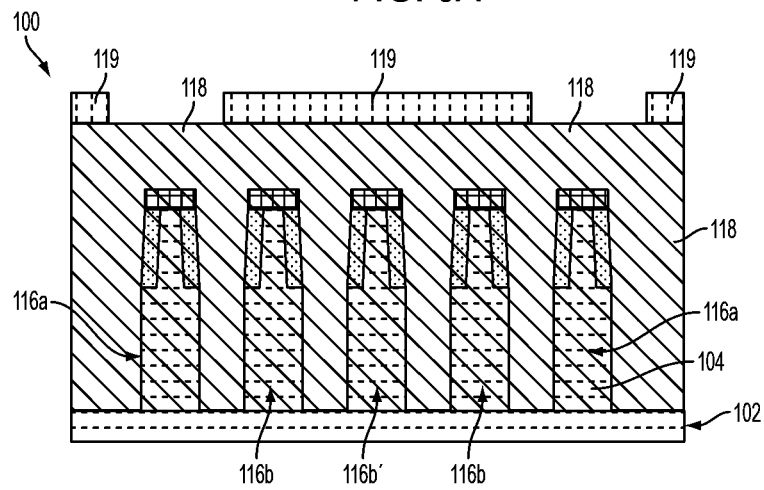
FIG. 6B is a cross-sectional view of the semiconductor device of FIG. 6A taken along line A-A'.

Turning to FIGS. 6A-6B, the patterning layer 119 is patterned according to various well-known patterning techniques. Accordingly, a portion of the underlying cut mask 118 is exposed. According to an embodiment, the pattern applied to the patterning layer 119 is aligned with one or more intended sacrificial fins 116a intended to be removed in a subsequent cutting process.

Figure 7A:
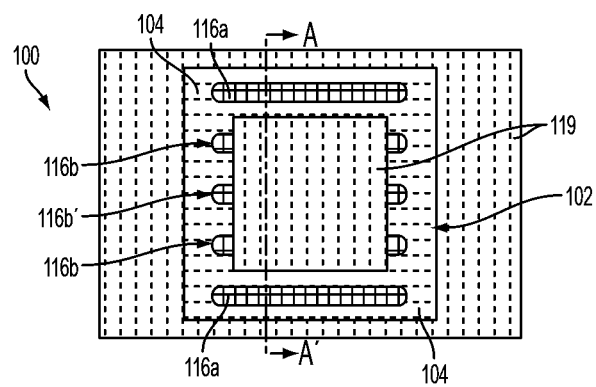
FIG. 7A illustrates the semiconductor device of FIGS. 6A-6B after etching the cut mask to expose sacrificial fins.
Figure 7B:
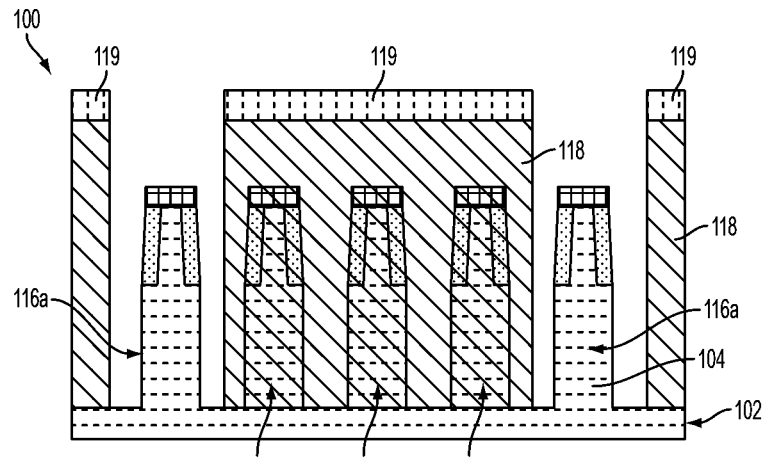
FIG. 7B is a cross-sectional view of the semiconductor device of FIG. 7A taken along line A-A'.

Referring to FIGS. 7A-7B, the semiconductor device 100 is illustrated after etching the exposed cut mask 118, thereby exposing one or more sacrificial fins 116a. Various etching techniques may be used to pattern the cut mask 118 including, but not limited to, a $N_2/H_2$ RIE process as understood by one of ordinary skill in the art. According to another embodiment, the one or more isolated semiconductor fins 116b can include a single nested fin 116b' interposed between a pair of semi-nested fins 116b. In various instances, the single nested fin 116b' may not substantially impact the semi-nested fins 116b. Accordingly, the single nested fin 116b' may be cut out from between the semi-nested fins 116b. In other words, a single nested fin 116b' can be completely isolated (i.e., directly surrounded by the semi-nested fins 116a). Accordingly, patterning of a completely isolated nested fin 116b' can be improved.

Figure 8A:
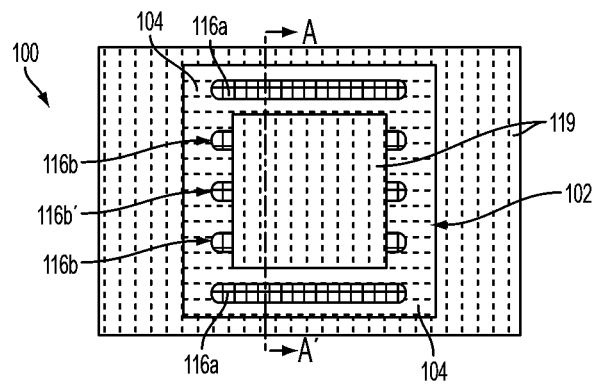
FIG. 8A illustrates the semiconductor device of FIGS. 7A-7B following a cutting process that removes the exposed sacrificial fins.
Figure 8B:
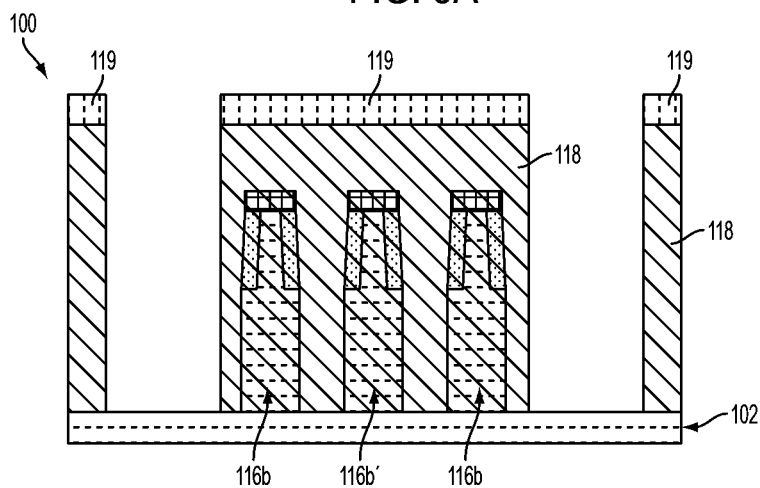
FIG. 8B is a cross-sectional view of the semiconductor device of FIG. 8A taken along line A-A'.
Figure 9A:
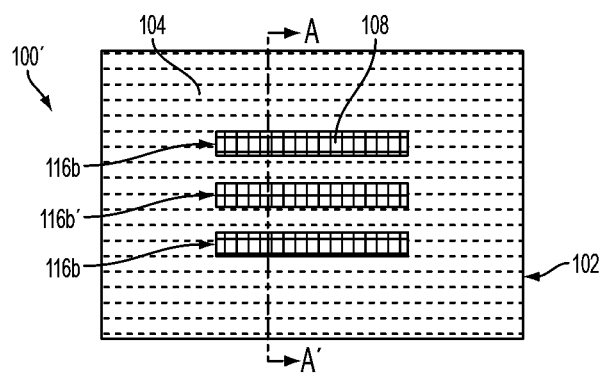
FIG. 9A illustrates an isolated semiconductor device following the removal of the sacrificial fins according to a non-limiting embodiment.
Figure 9B:
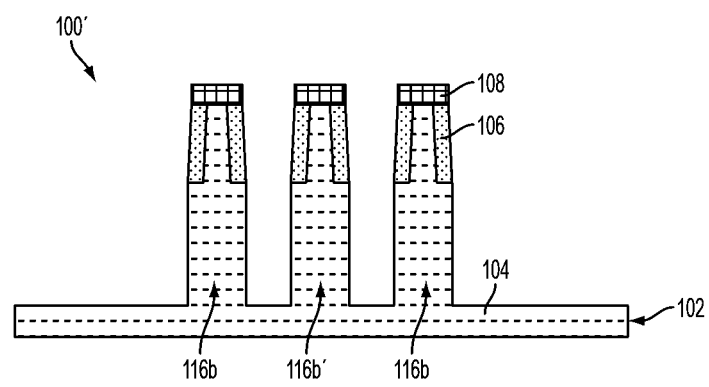

Turning now to FIGS. 8A-8B, a cutting process is performed that removes the previously exposed sacrificial fins 116a, and the remaining portions of the cut mask 118. According to a non-limiting embodiment, the previously exposed sacrificial fins 116a and the cut mask 118 may be removed at the same time. For example, the cut mask 118 may be patterned to expose only the top portion of the fin/hardmask, which can then be removed completely. Accordingly, an isolated semiconductor device 100' is formed as shown in FIGS. 9A-9B.

Figure 10:
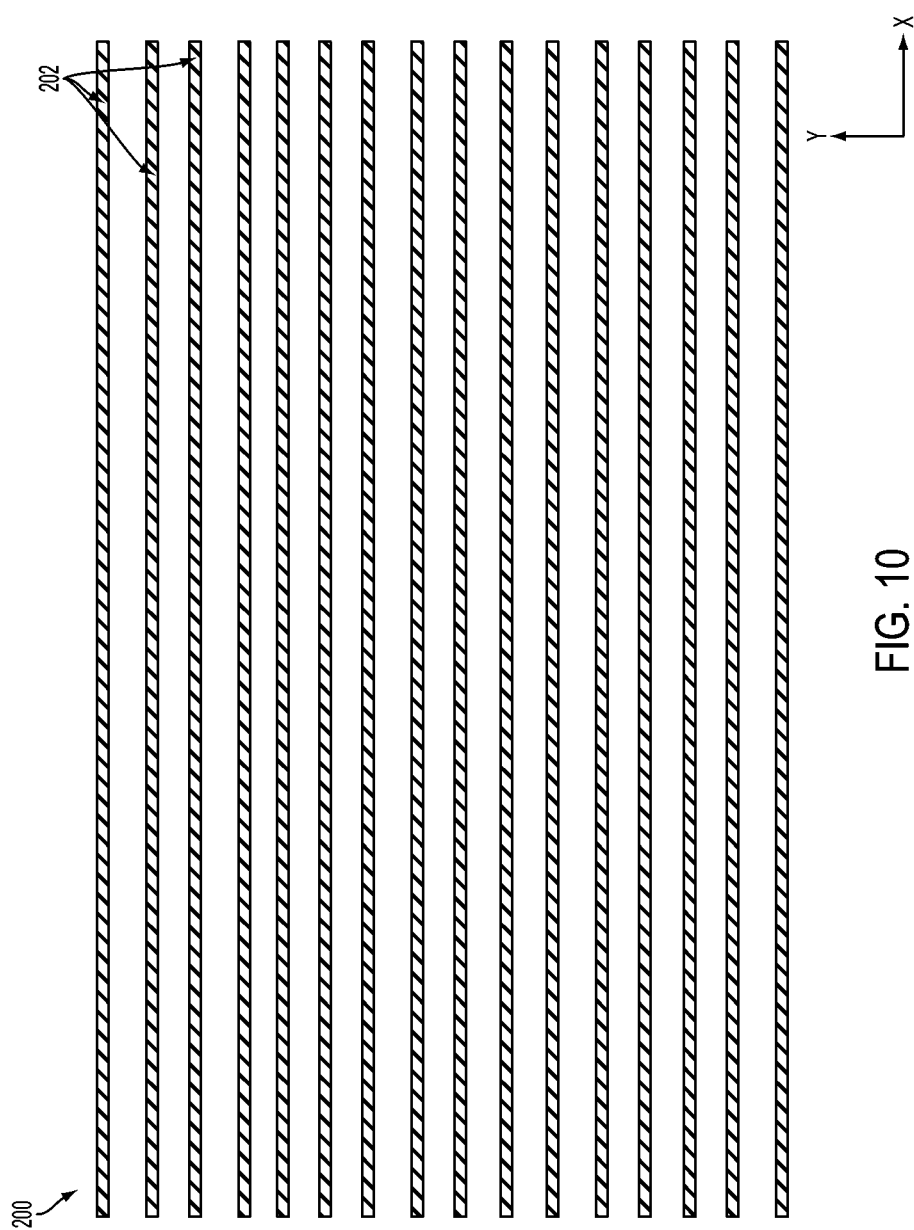

A series of views illustrating various masking patterns for forming patterning assist features according to an exemplary embodiment are illustrated in FIGS. 10-15. Referring to FIG. 10, a top view of a semiconductor device 200 is illustrated. The upper surface of the semiconductor device 200 includes a plurality of active semiconductor regions 202 formed thereon. The active semiconductor regions 202 extend in a first direction (X) to define a length and a second direction (Y) to define a width. According to an embodiment, the active semiconductor regions 202 are preliminary semiconductor fins formed according to a first etching process.

Figure 11:
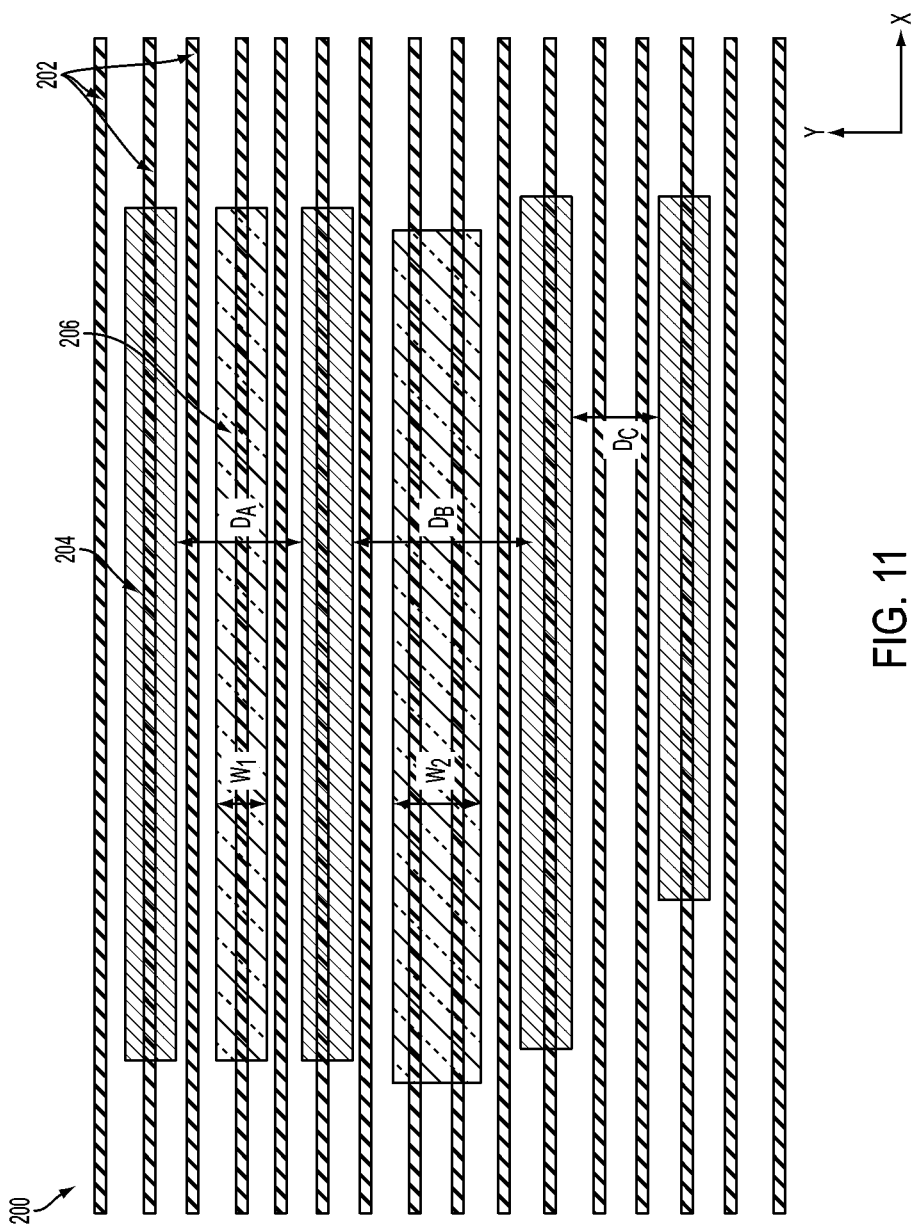

Turning to FIG. 11, masking element patterns 204 and printing assist feature patterns 206 are shown covering respective active semiconductor regions 202 of the semiconductor device 200. According to an embodiment, the masking element patterns 204 and printing assist feature patterns 206 are arranged according to a feature patterning table or an etching model. The patterning table may be based on various parameters including, but not limited to, a distance ($D_A$, $D_B$, $D_C$) between adjacent masking patterns 204, a number of the at least one patterning assist feature patterns 206, and a width ($W_1$, $W_2$) of one or more patterning assist feature patterns 206. The etching model is based on lithographic exposure patterns and resist exposure/development characteristics of a masking layer used to form masking elements and patterning assist features on the semiconductor device 200.

Figure 12:
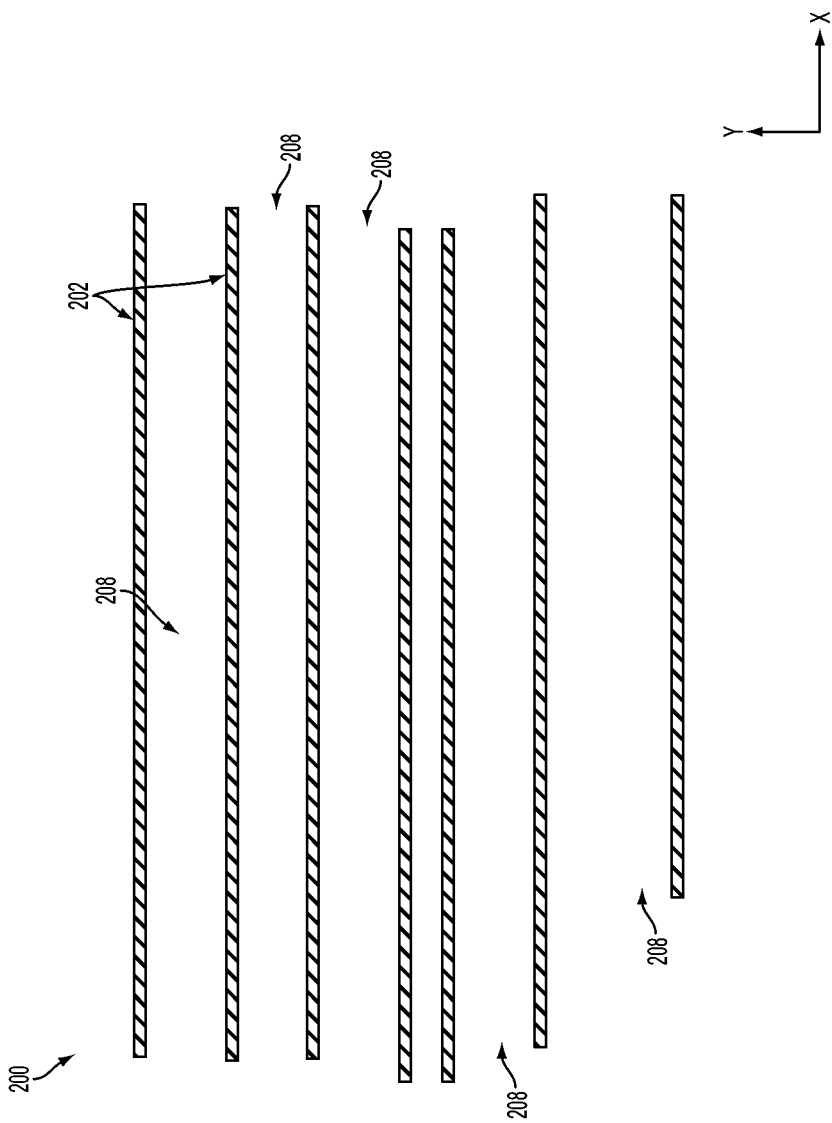

Turning now to FIG. 12, the semiconductor device 200 is illustrated following an etching process that removes exposed portions of the active semiconductor regions 202. Various etching process for selectively removing the active semiconductor regions 202 may be used as understood by one of ordinary skill in the art. Accordingly, one or more voids 208 are formed on the surface of the semiconductor device 200.

Figure 13:
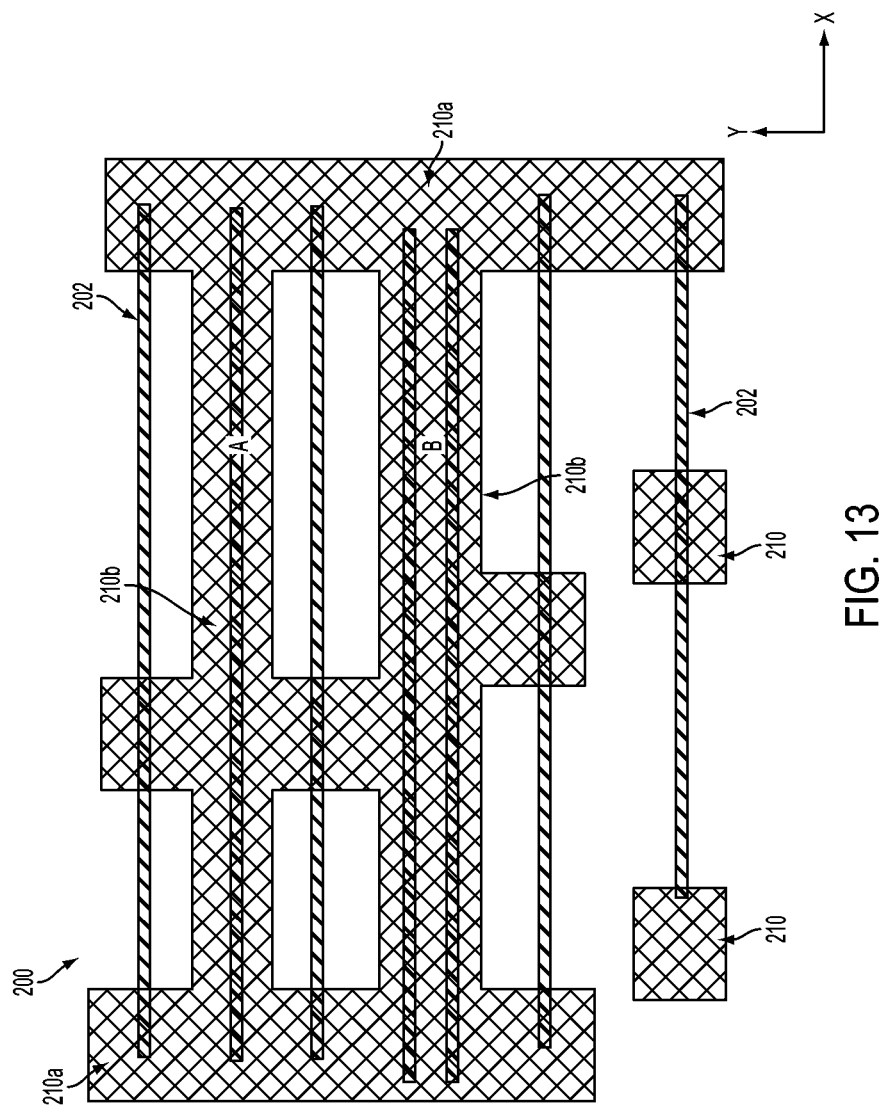

FIG. 13 illustrates the semiconductor device of FIG. 10 showing a cut mask pattern 208 covering respective active semiconductor regions 202. According to an embodiment, the cut mask pattern 210 includes one or more vertical cut mask segments 210a that extend perpendicular to the active semiconductor regions 202, and one or more horizontal cut mask segments 210b that extend parallel to the active semiconductor regions 202. In this manner, combinations of the vertical cut mask segments 210a and the horizontal cut mask segments 210b can be used to entirely cover one or more active semiconductor regions 202. According to an embodiment, the cut mask pattern 210 is an inverse masking pattern where portions covered by the cut mask pattern 210 are intended to be exposed and cut away during a cutting process.

Figure 14:
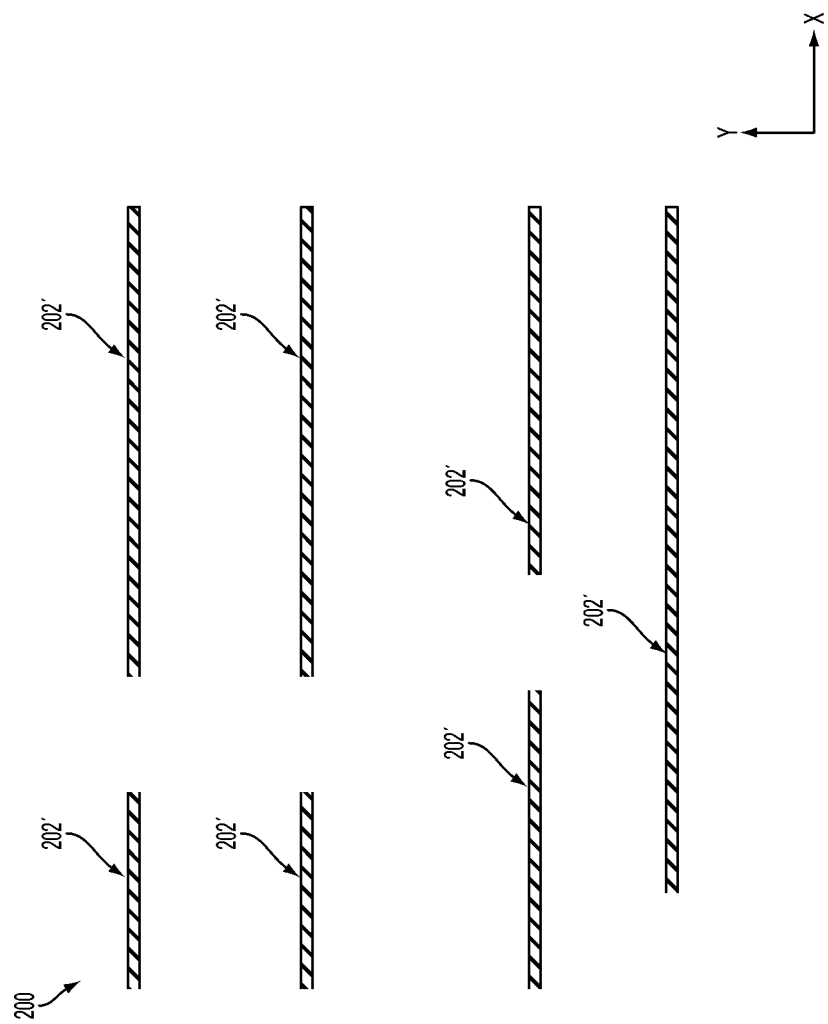
Figure 15:
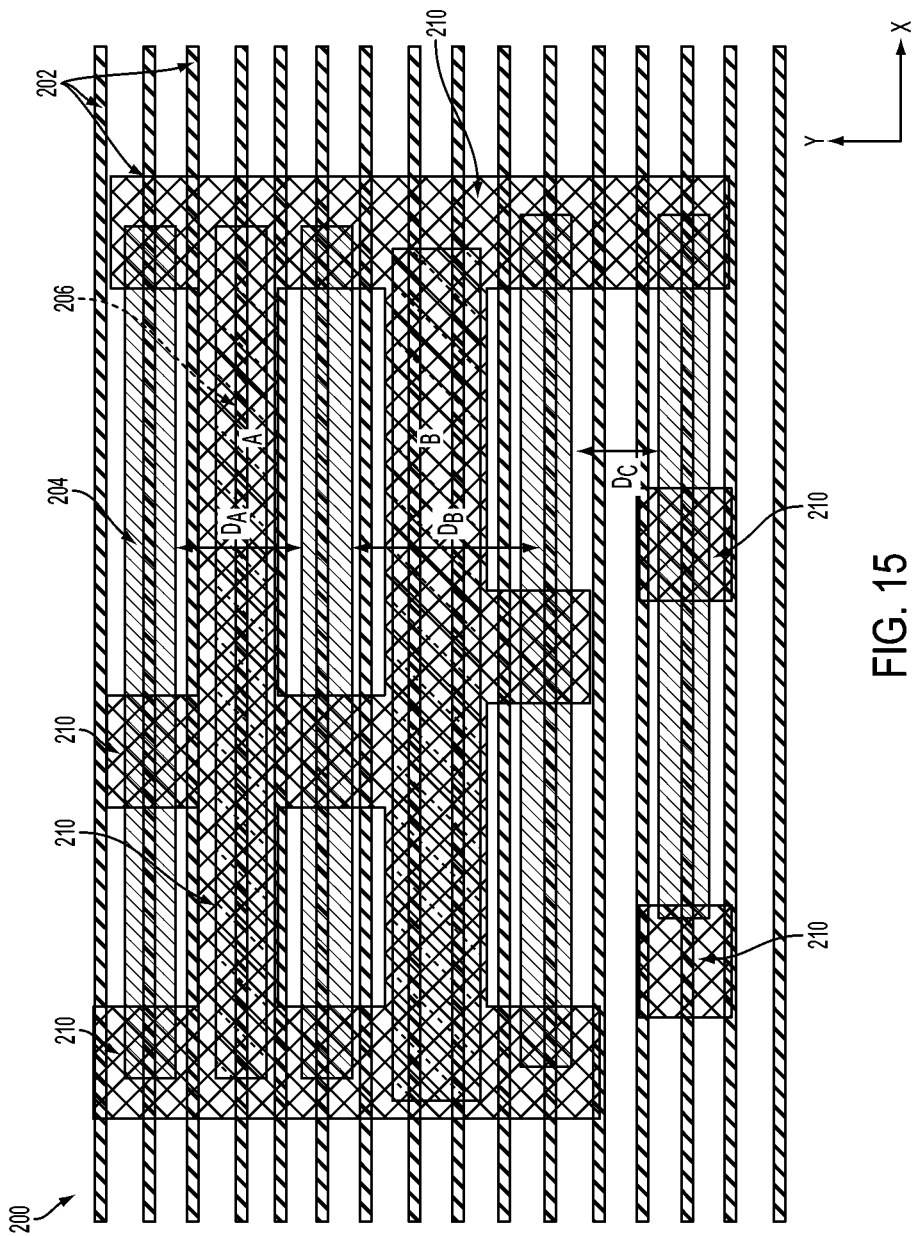

Turning to FIG. 14, the semiconductor device 200 is illustrated following a cutting process that removes the portions of the active semiconductor regions 202 according to the cut mask pattern 208. Accordingly, a final semiconductor device 200 is formed having one or more isolated active semiconductor regions 202' based on the various masking patterns described above. For convenience, FIG. 15 illustrates the masking patterns used to form the isolated active semiconductor regions 202' of the final semiconductor device 200 illustrated in FIG. 14 according to an exemplary embodiment.

Figure 16A:
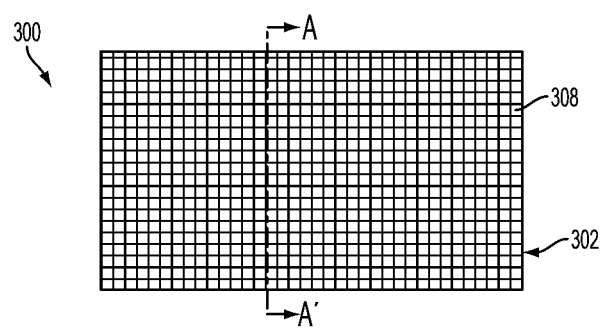
Figure 16B:
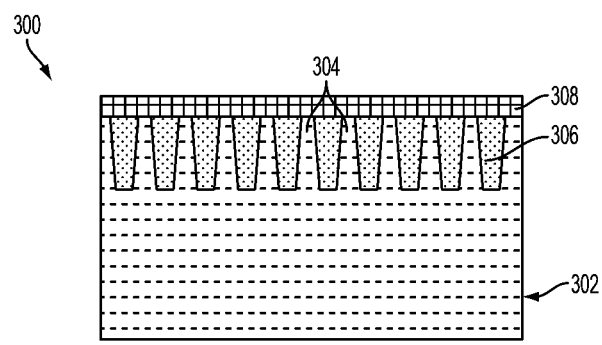
FIG. 16B is a cross-sectional view of the starting substrate illustrated in FIG. 16A taken along the lines A-A'.

A series of views illustrating a method of forming a finFET device using patterning assist features according to another exemplary embodiment is illustrated in 16A-23B. Referring now to FIGS. 16A-16B, a semiconductor device 300 is illustrated according to an exemplary embodiment. The semiconductor device 300 includes a semiconductor substrate 302, a plurality of active semiconductor regions 304, oxide material 306 deposited between the active semiconductor regions 304, and a hardmask layer 308 formed on an upper surface of the active semiconductor regions 304 and the oxide material 306. The semiconductor substrate 302 may be formed from, for example, silicon (Si). Although a bulk semiconductor substrate 302 is illustrated, it is appreciated that the semiconductor substrate 302 may be formed as a semiconductor-on-insulator (SOI) substrate as understood by one of ordinary skill in the art. The oxide material 306 is formed from an oxide material such as, for example, silicon dioxide ($SiO_2$). The hardmask layer 308 is formed from, for example, silicon nitride (SiN).

Figure 17A:
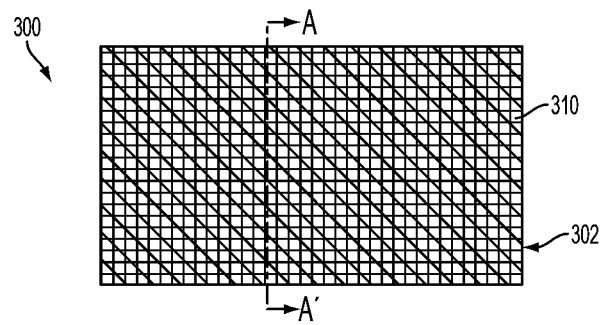
FIG. 17A illustrates the semiconductor device of FIGS. 16A-16B following deposition of a cut mask formed on an upper surface of the hardmask layer.
Figure 17B:
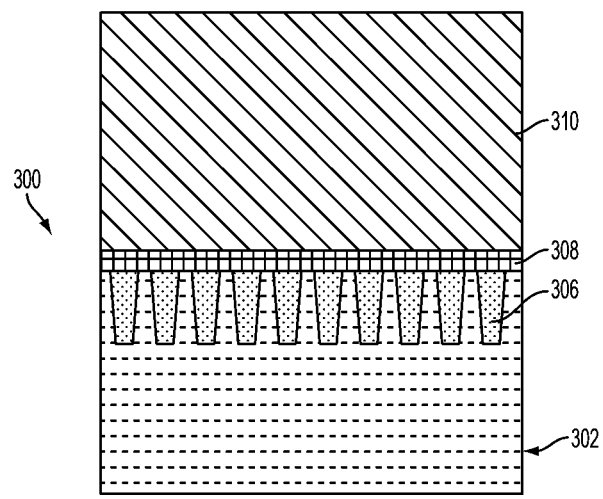
FIG. 17B is a cross-sectional view of the semiconductor device illustrated in FIG. 17A taken along line A-A'.

Referring to FIGS. 17A-17B, a cut mask 310 is deposited on an upper surface of the hardmask 308. The cut mask 310 may be formed from various materials including, but not limited to, an organic planarizing layer (OPL), antireflective coating (ARC), and photoresist lithography stack.

Figure 18A:
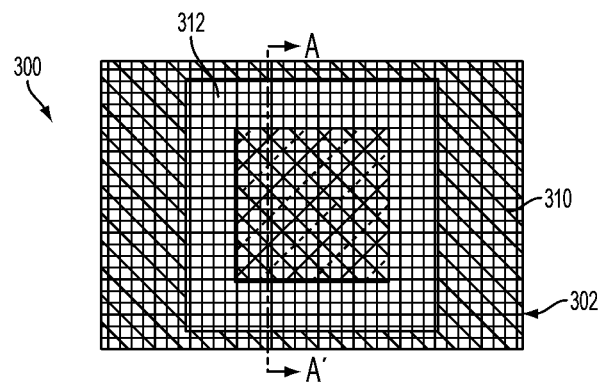
FIG. 18A illustrates the semiconductor device of FIGS. 17A-17B after patterning the cut mask layer to expose a portion of the underlying hardmask layer.
Figure 18B:
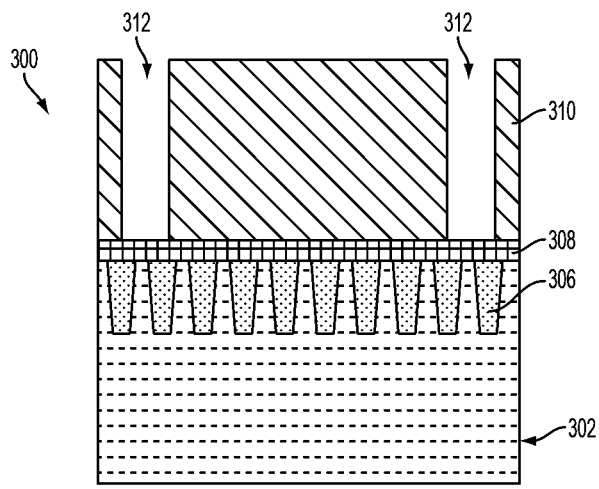
FIG. 18B is a cross-sectional view of the semiconductor device illustrated in FIG. 18A taken along line A-A'.

Turning now to FIGS. 18A-18B, the semiconductor device 300 is illustrated after patterning the cut mask 310. Accordingly, one or more voids 312 are formed in the cut mask 310 to expose a portion of the hardmask 308. One or more voids 312 define a cut mask pattern in the cut mask 310. Various etching techniques may be used to form the voids 312 including, but not limited to, RIE using an $N_2/H_2$ etching process as understood by one of ordinary skill in the art.

Figure 19A:
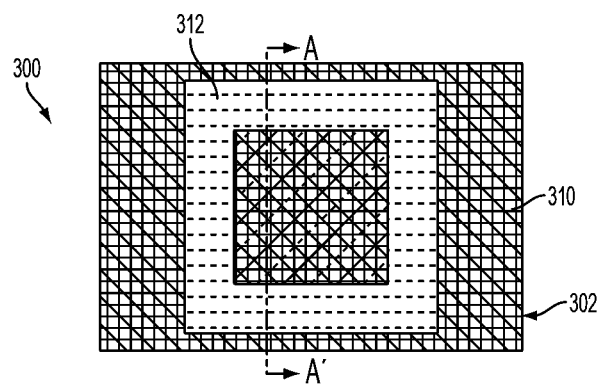
FIG. 19A illustrates the semiconductor device of FIGS. 18A-18B following a first etching process that forms voids through the hardmask layer and transfers the pattern of the cut mask layer into the substrate of the semiconductor device.
Figure 19B:
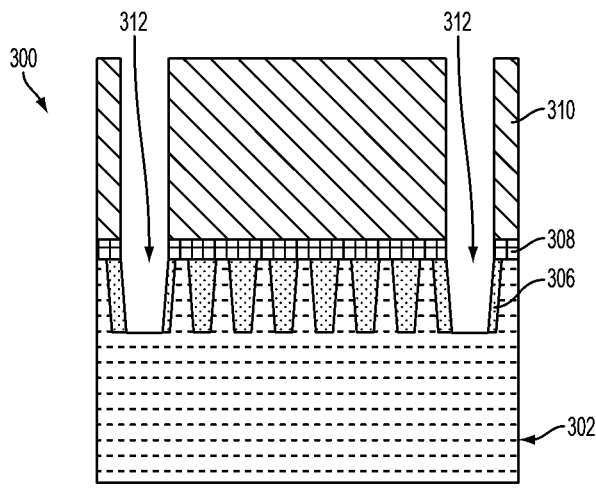
FIG. 19B is a cross-sectional view of the semiconductor device illustrated in FIG. 19A taken along line A-A'.

Referring to FIGS. 19A-19B, the semiconductor device 300 is illustrated following a first etching process which transfers the cut mask pattern defined by the voids 312 into the oxide material 306. Various etching techniques for selectively etching the hardmask 308, oxide material 306, and/or the semiconductor substrate 302 may be used as understood by one of ordinary skill in the art including, but not limited to, RIE using octafluorocyclobutane ($C_4F_8$), Tetrafluoromethane ($CF_4$) and Hydrogen bromide (HBr) like chemical etching processes.

Figure 20A:
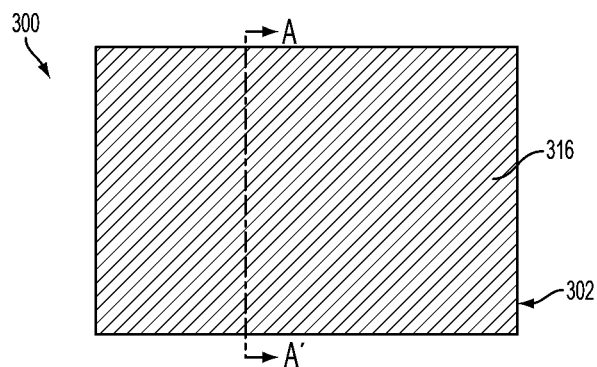
FIG. 20A is illustrates the semiconductor device shown in FIGS. 19A-19B following deposition of an organic planarizing layer.
Figure 20B:
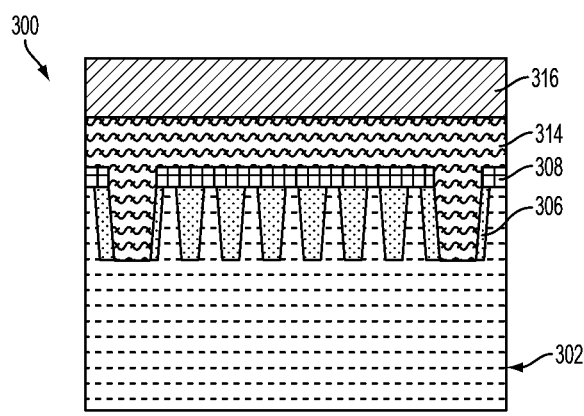
FIG. 20B is a cross-sectional view of the semiconductor device illustrated in FIG. 20A taken along line A-A'.

Turning to FIGS. 20A-20B, remaining portions of the cut mask 310 are removed and a first OPL 314 is deposited on the upper surface of the hardmask 308 and in the voids 312. A masking layer 316 is then deposited on an upper surface of the first OPL 314. The masking layer 316 may be formed from various materials including, but not limited to, an organic or inorganic photosensitive material or electron-beam-sensitive material. According to an embodiment, the masking layer 316 may be formed as a multi-layer OPL film including, but not limited to, an OPL film layer, an anti-reflective coating (ARC) layer formed on the OPL film layer, and a photoresist layer formed on ARC layer. The ARC layer may include, but is not limited to, a standard non-developed ARC layer, a developable OPL film layer, and/or a developable ARC layer. In cases where the masking layer 316 is formed from a photosensitive material, the masking layer 316 may be sensitive to a deep ultraviolet (DUV) radiation, a mid-ultraviolet (MUV) radiation, or an extreme ultraviolet (EUV) radiation. In cases where the masking layer 316 is formed from an electron-beam-sensitive material, the masking layer 316 is sensitive to electron beam radiation. The masking layer 316 may comprise a single layer of photoresist, or may include a top anti-reflective-coating (TARC) layer and/or a bottom anti-reflective-coating (BARC) layer. The masking layer 316 may also include any TARC layer or any BARC layer formed therein.

Figure 21A:
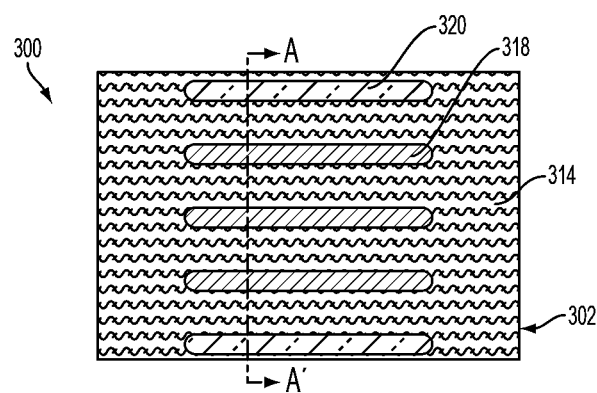
FIG. 21A illustrates the semiconductor device of FIGS. 20A-20B after patterning the masking layer to form masking elements and patterning assist elements on the oxide layer.
Figure 21B:
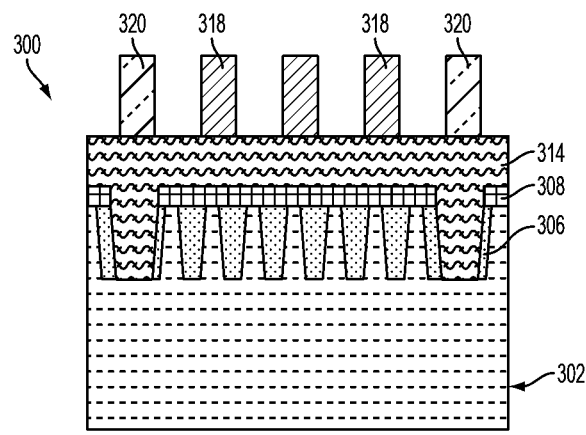
FIG. 21B is a cross-sectional view of the semiconductor device shown in FIG. 21A.

Turning to FIGS. 21A-21B, the semiconductor device 300 is illustrated after patterning the masking layer 316 according to a well-known lithography process as understood by one of ordinary skill in the art. Accordingly, a plurality of isolated masking elements 318 and a plurality of patterning assist features 320 are formed on an upper surface of the first OPL 314 to define a dense array pattern.

Figure 22A:
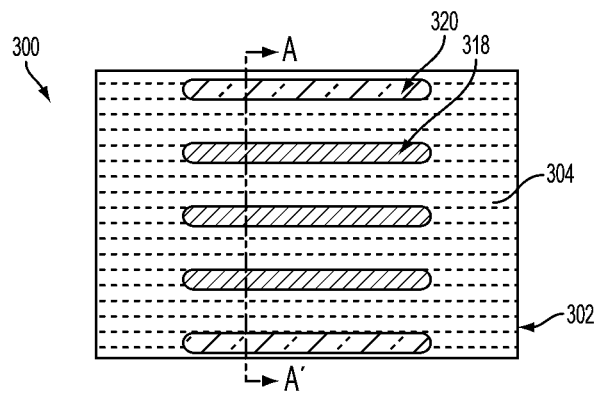
FIG. 22A illustrates the semiconductor device of FIGS. 21A-21B after performing a second etching process that transfers the pattern of the masking layer into the semiconductor substrate such that a plurality of semiconductor fins are formed on the substrate.
Figure 22B:
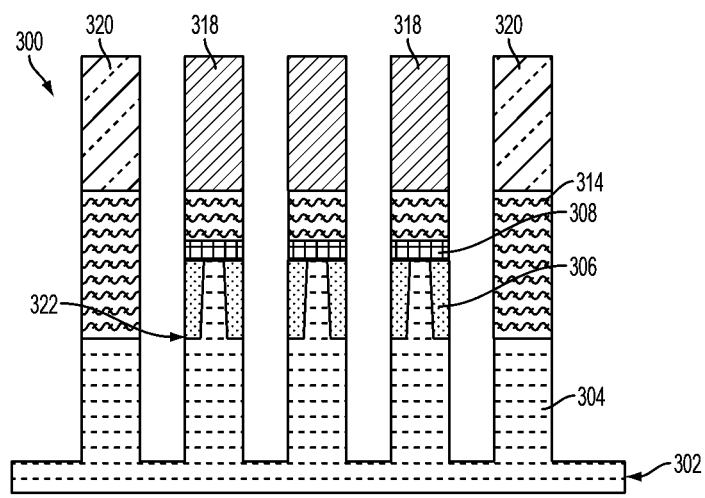
FIG. 22B is a cross-sectional view of the semiconductor device shown in FIG. 22A taken along lines A-A'.
Figure 23A:
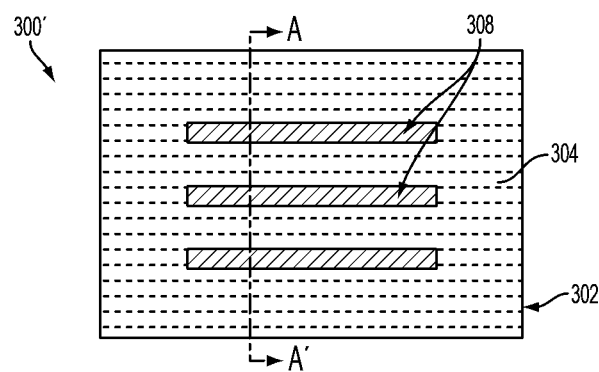
FIG. 23A illustrates the semiconductor device of FIGS. 22A-22B showing an isolated semiconductor device including isolated semiconductor fins having a reduced CD.
Figure 23B:
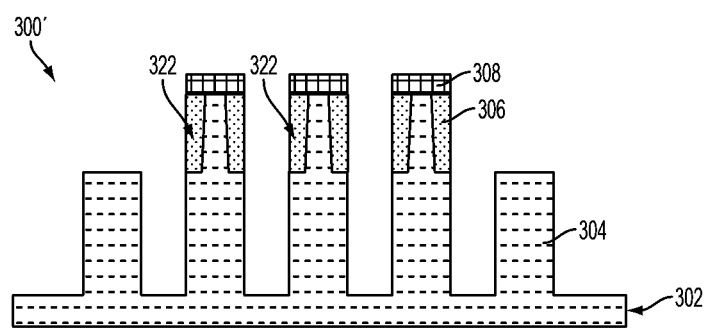

Turning now to FIGS. 22A-22B, the semiconductor device 300 is illustrated after performing an etching process that transfers the dense array pattern defined by the isolated masking elements 318 and a plurality of patterning assist features 320 into the semiconductor substrate 302. The etching process performed is a RIE process, for example. According to an embodiment, one or more semiconductor fins 322 are formed in the semiconductor substrate 302 based on the dense array pattern as further illustrated in FIGS. 21A-21B. The patterning assist features 320 realize diffusion of reactive neutral species generated by the RIE process such that passivation to the sidewalls of the at least one isolated fin is reduced. Accordingly, the micro loading effect realized by the semiconductor fins 322 is reduced such that the overall critical dimension (CD) of the semiconductor fins 322 is reduced Referring now to FIGS. 23A-23B, the semiconductor device 300 is illustrated after removing the masking elements 318, patterning assist features 320, and remaining portions of the first OPL 314. Accordingly, an isolated semiconductor device 300' is formed. In this case, the remaining semiconductor fins 322 have a reduced CD following the RIE process described above as compared to semiconductor device formed according to conventional fabrication methods.

Figure 24:
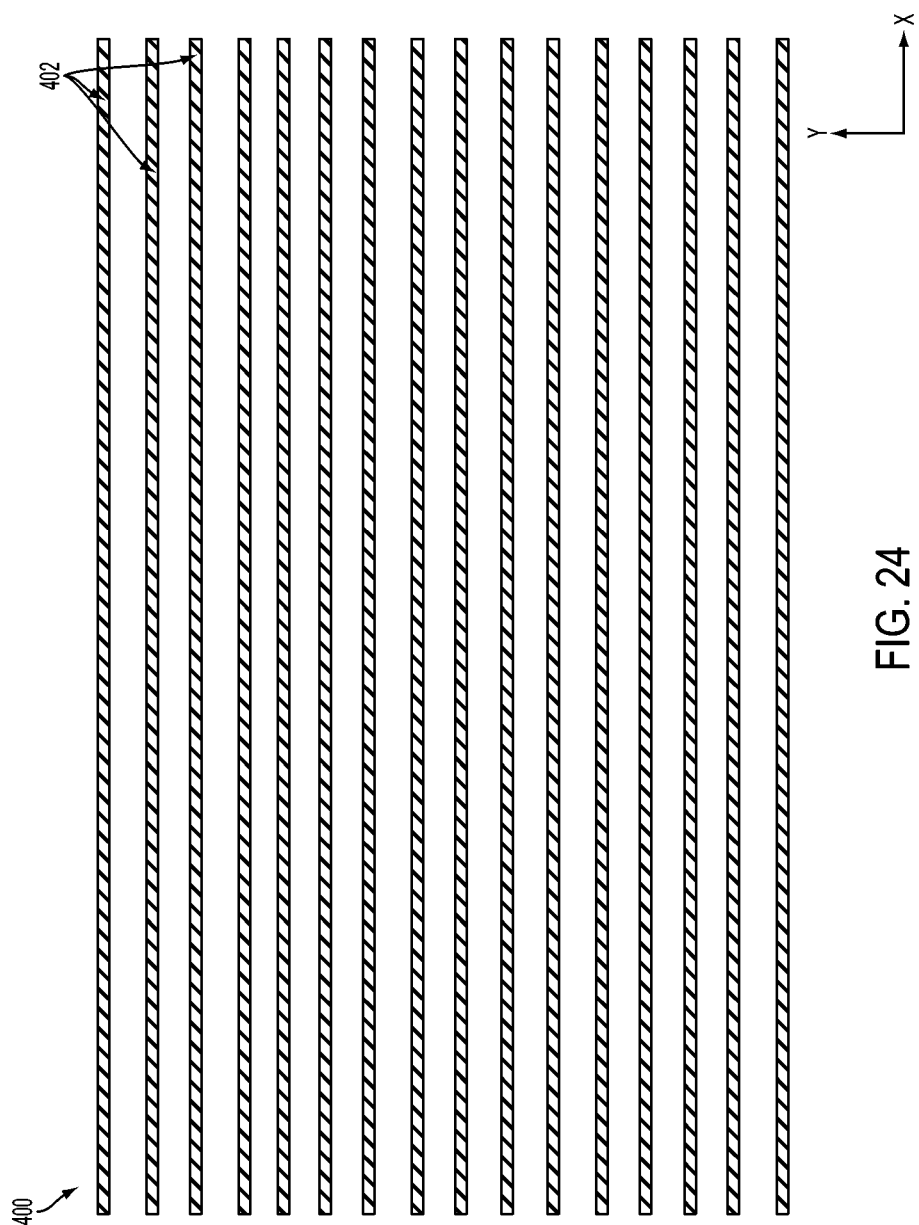

A series of views illustrating masking patterns for forming patterning assist features according to another exemplary embodiment are illustrated in FIGS. 24-29. Referring to FIG. 24, a top view of a semiconductor device 400 is illustrated. The upper surface of the semiconductor device 400 includes a plurality of active semiconductor regions 402 formed thereon. According to an embodiment, the active semiconductor regions 402 are preliminary semiconductor fins formed according to a first etching process.

Figure 25:
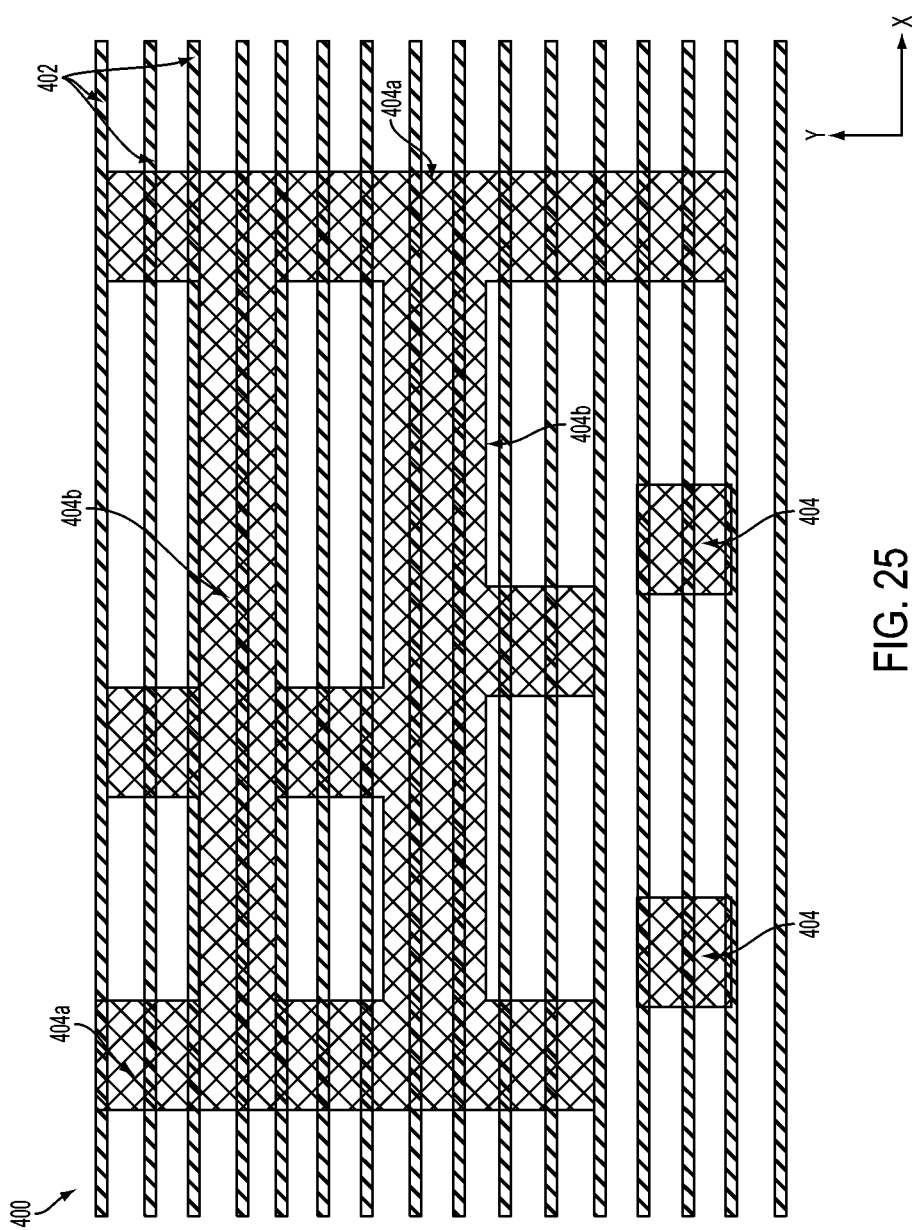

Turning to FIG. 25, cut mask patterns 404 are shown covering respective active semiconductor regions 402 of the semiconductor device 400. According to an embodiment, the cut mask patterns 404 include one or more vertical cut mask patterns 404a that extend perpendicular to the active semiconductor areas 402, and one or more horizontal cut mask patterns 404b that extend parallel to the active semiconductor regions 402. In this manner, combinations of the vertical cut mask patterns 404a and the horizontal cut mask patterns 404b can be used to entirely cover one or more active semiconductor regions 402. According to a non-limiting embodiment, the cut mask patterns 404 are inverse masking patterns where portions covered by the cut mask patterns 404 are intended to be exposed and cut away during a cutting process.

Figure 26:
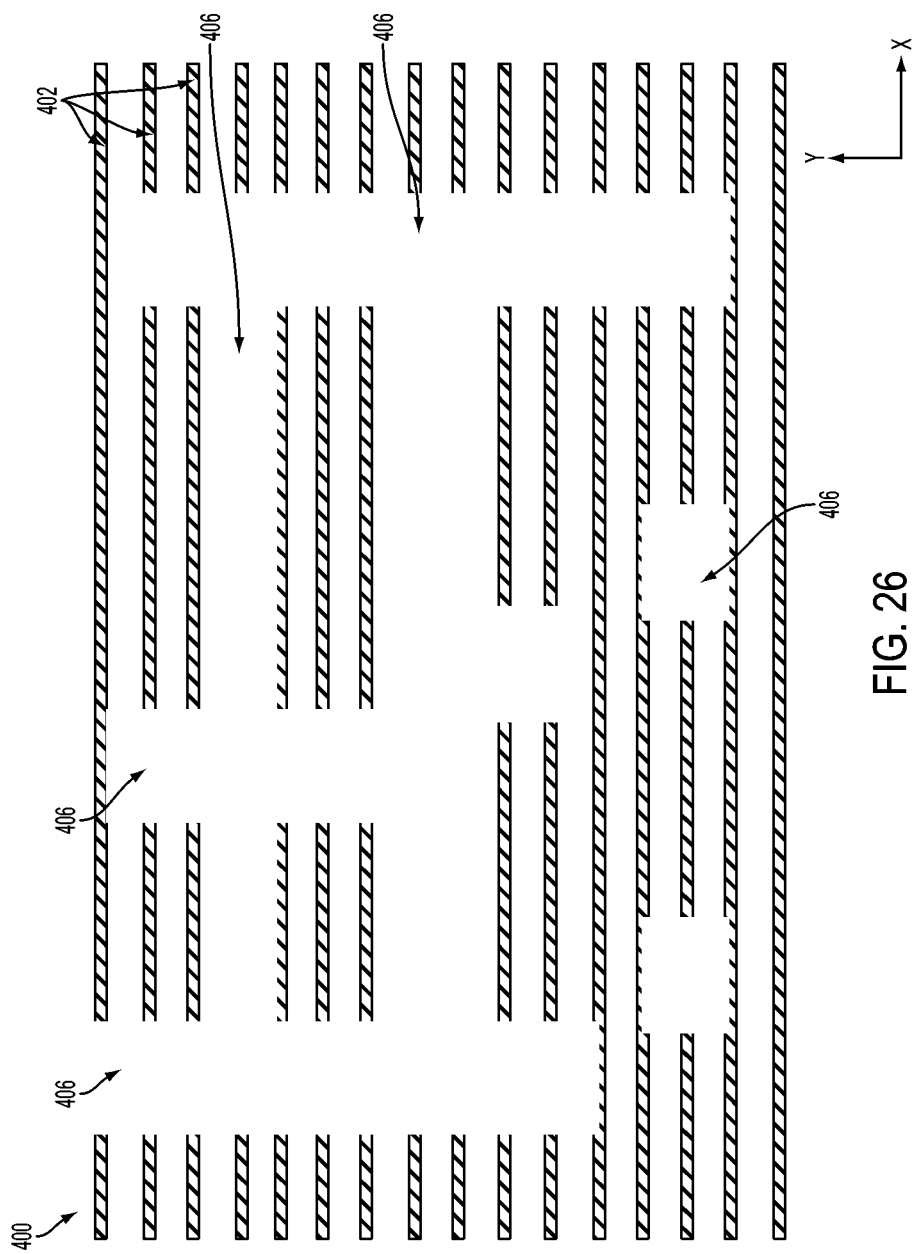

Turning to FIG. 26, the semiconductor device 400 is shown following a cutting process that cuts portions of the active semiconductor regions 402 according to the cut mask patterns 404. The cutting process forms respective voids 406 in the upper surface of the semiconductor device 400. The cutting process may include, for example, a RIE using octafluorocyclobutane ($C_4F_8$), Tetrafluoromethane ($CF_4$) and Hydrogen bromide (HBr) like chemical etching processes.

Figure 27:
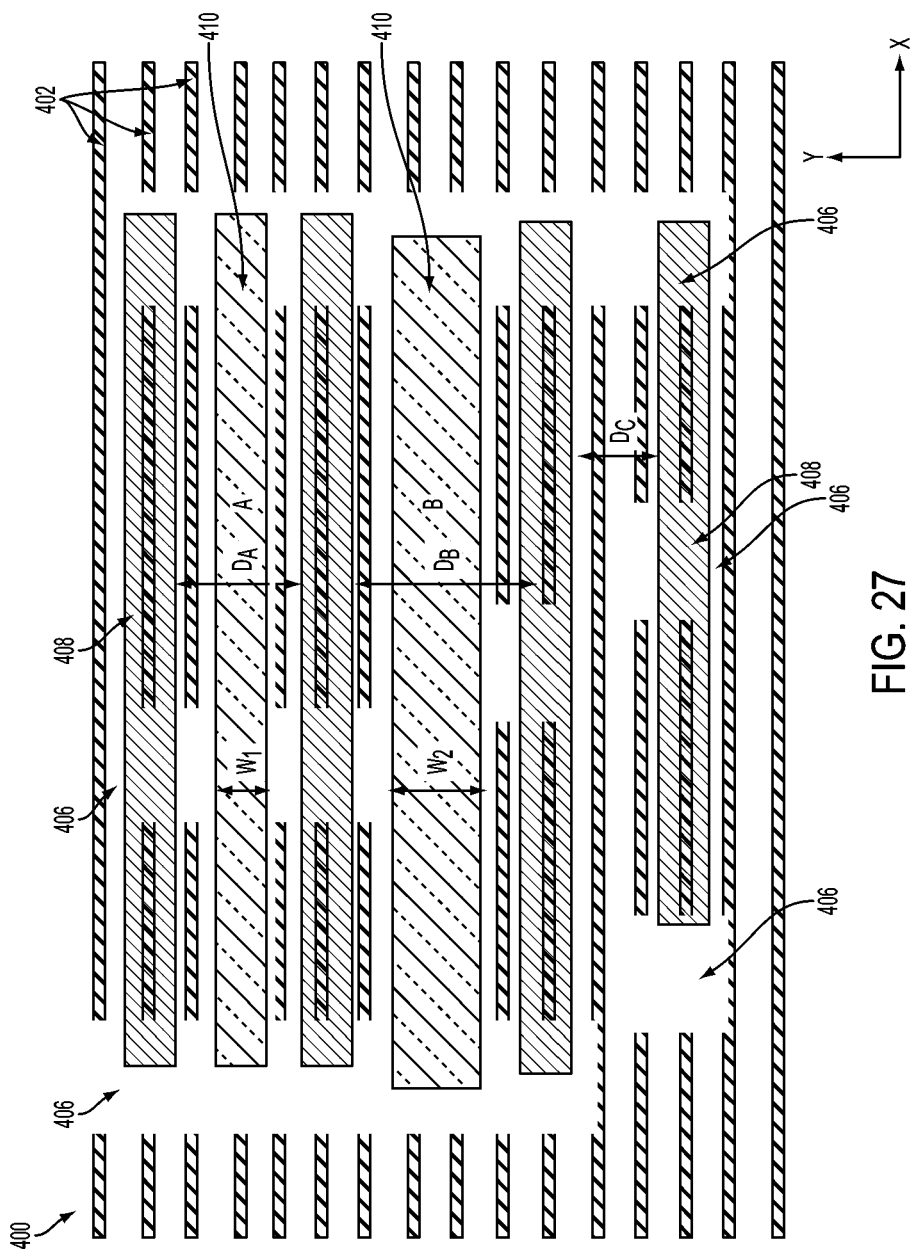

Referring to FIG. 27, masking element patterns 408 and patterning assist feature patterns 410 are shown on the semiconductor device 400. The masking element patterns 408 cover selected active semiconductor regions 402 for forming respective masking elements thereon. The patterning assist feature patterns 410 are located in the voids 406 for forming patterning assist features therein. According to an embodiment, the masking element patterns 408 and printing assist feature patterns 410 are arranged according to a feature patterning table or an etching model. The patterning table may be based on various parameters including, but not limited to, a distance ($D_A$, $D_B$, $D_C$) between adjacent masking patterns 408, a number of the at least one patterning assist feature patterns 410, and a width ($W_1$, $W_2$) of the one or more patterning assist feature patterns 410. The etching model is based on lithographic exposure patterns and resist exposure/development characteristics of a masking layer used to form masking elements and patterning assist features on the semiconductor device 400.

Figure 28:
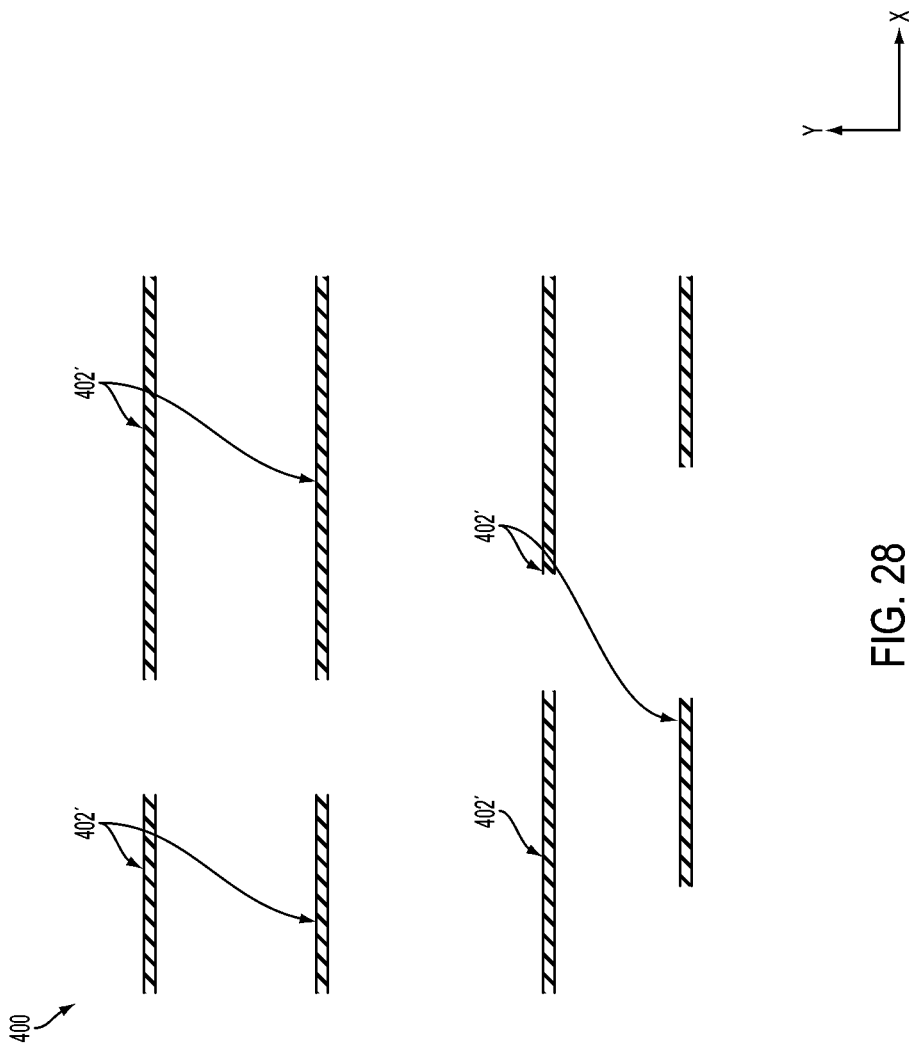
Figure 29:
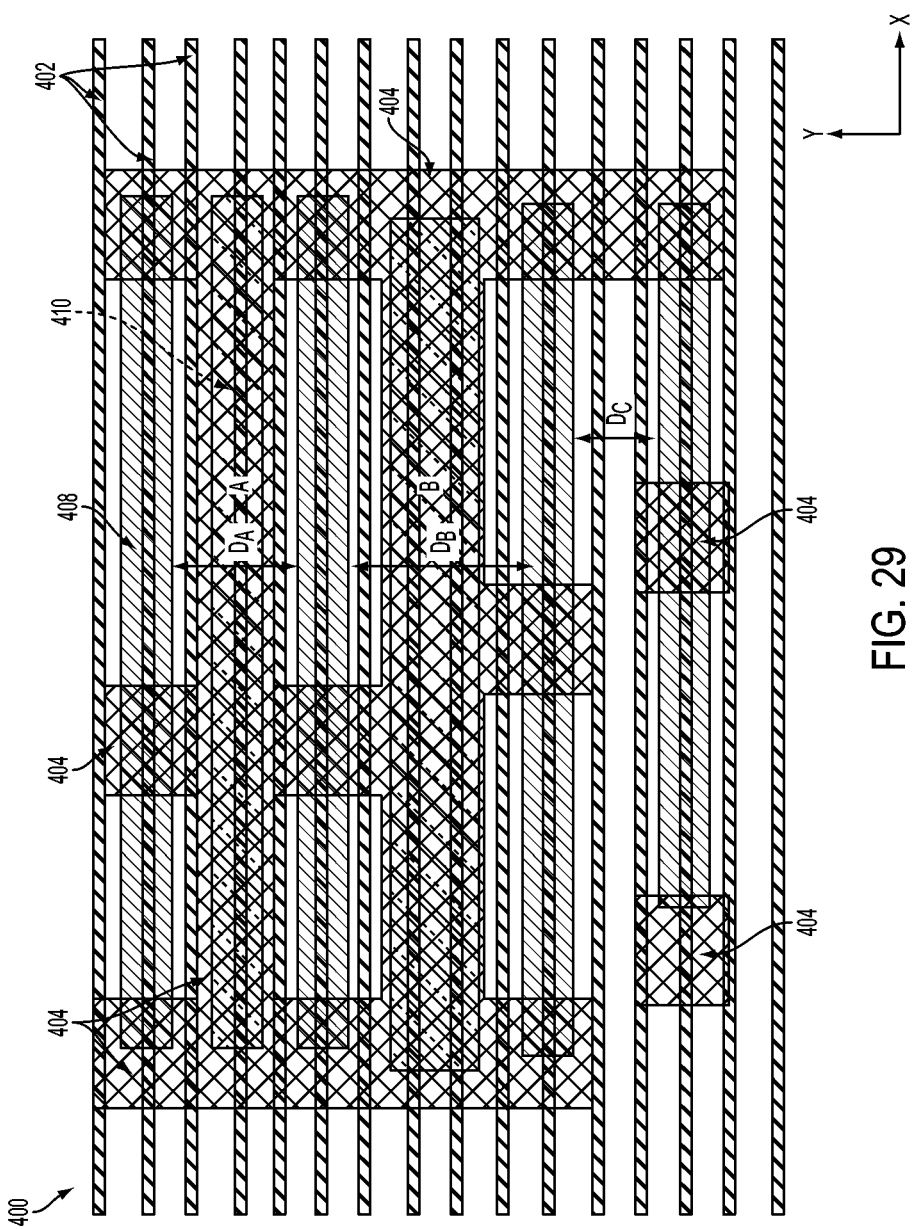

Turning now to FIG. 28, the semiconductor device 400 is shown following a cutting process that removes exposed portions of the active semiconductor regions according to the masking element patterns 408. According to additional embodiment, patterning assist features formed in the voids 406 may also be removed after performing the cutting process. In this manner, a final semiconductor device 400' is formed having one or more isolated active semiconductor regions 402' based on the various masking patterns described above. For convenience, FIG. 29 illustrates the masking patterns used to form the isolated active semiconductor regions 402' of the final semiconductor device 400' illustrated in FIG. 28 according to an exemplary embodiment.

Figure 30:
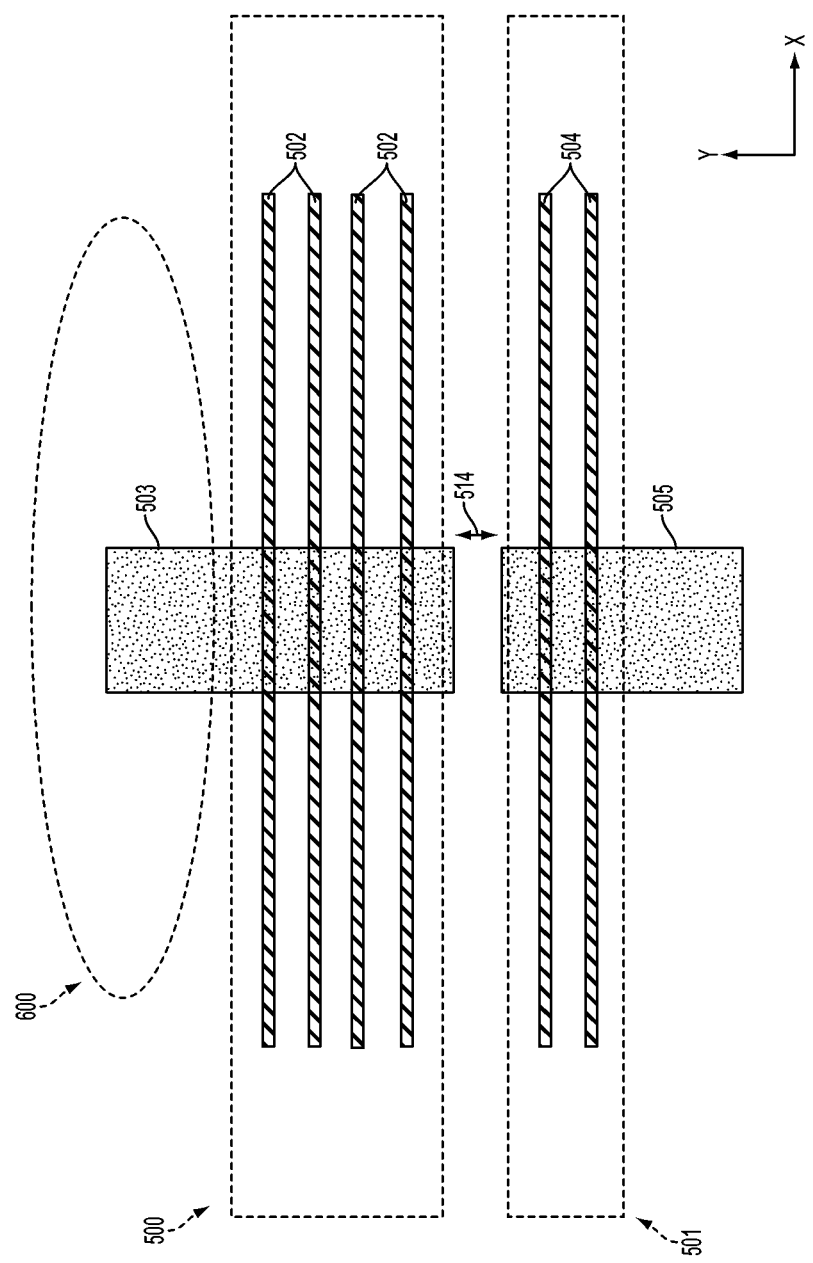

Turning to FIG. 30, a final semiconductor device is shown following a fabrication process that excludes a cut mask from the gate extension. The final semiconductor device includes a first gate conductor 503 separated from a second gate conductor 505 following a gate conductor cutting process. As illustrated, a portion of the first gate conductor 503, for example, remains intact and occupies an open area, i.e., a gate extension area 600 adjacent to an active semiconductor region of device 500. This illustrated process, however, leaves one or more of the active semiconductor fins 502 susceptible to over-etching.

Figure 31:
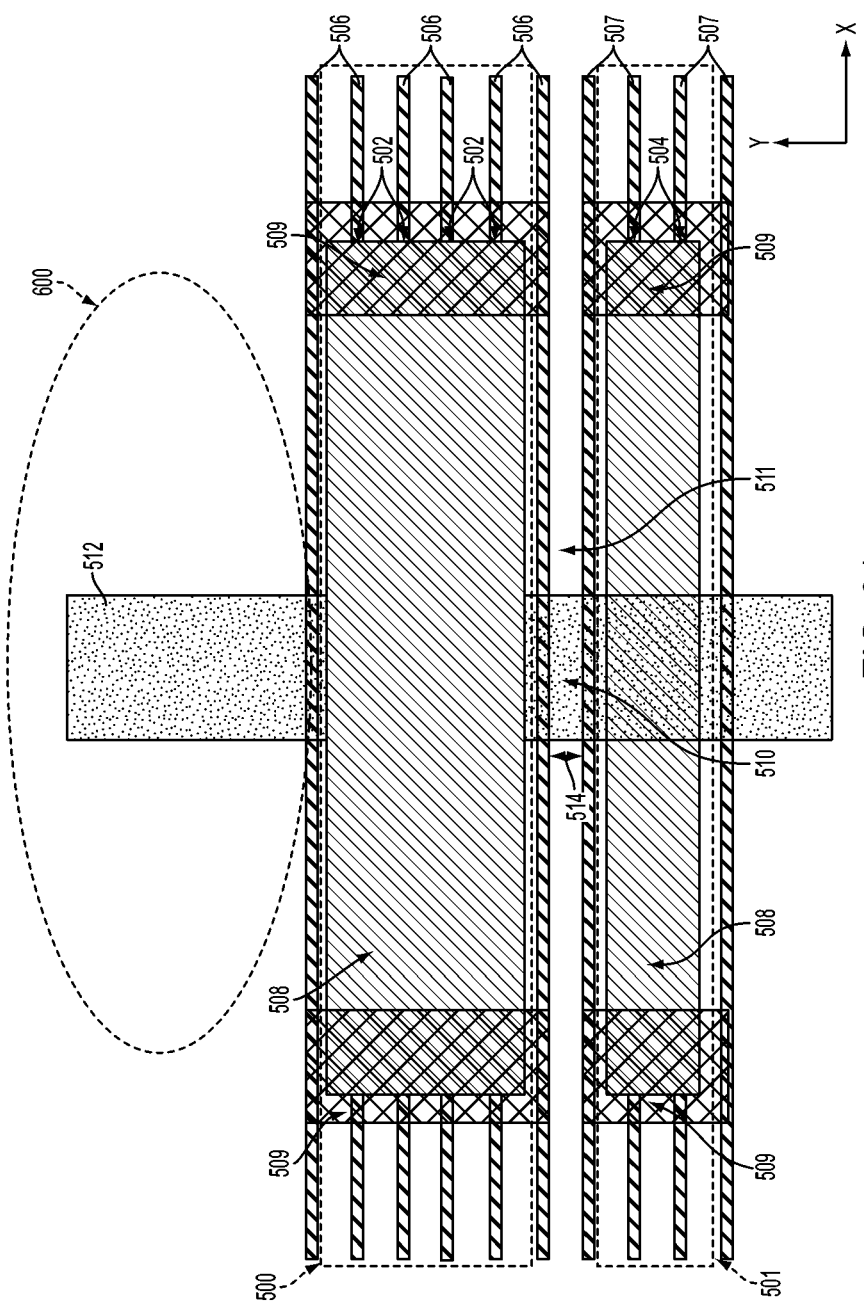
Figure 32:
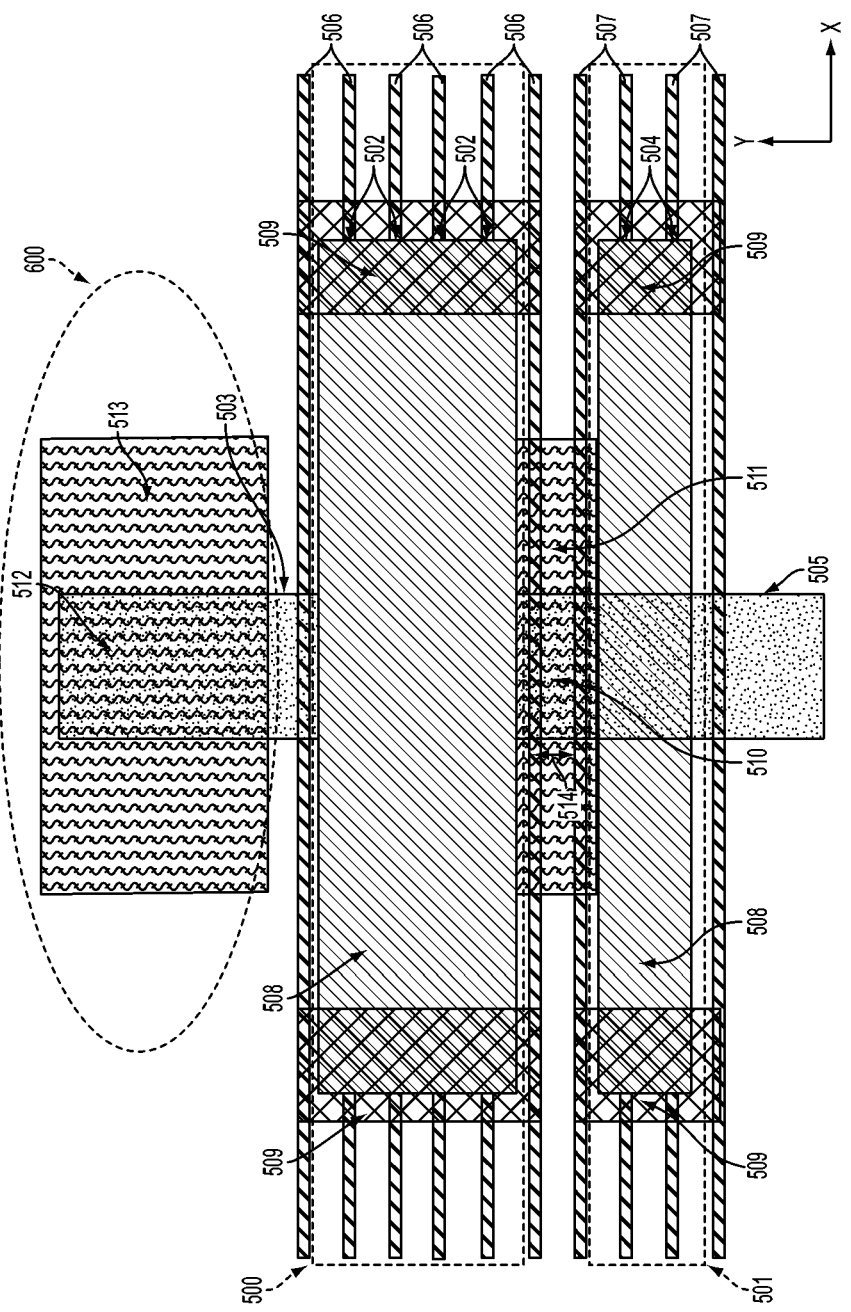
Figure 33:
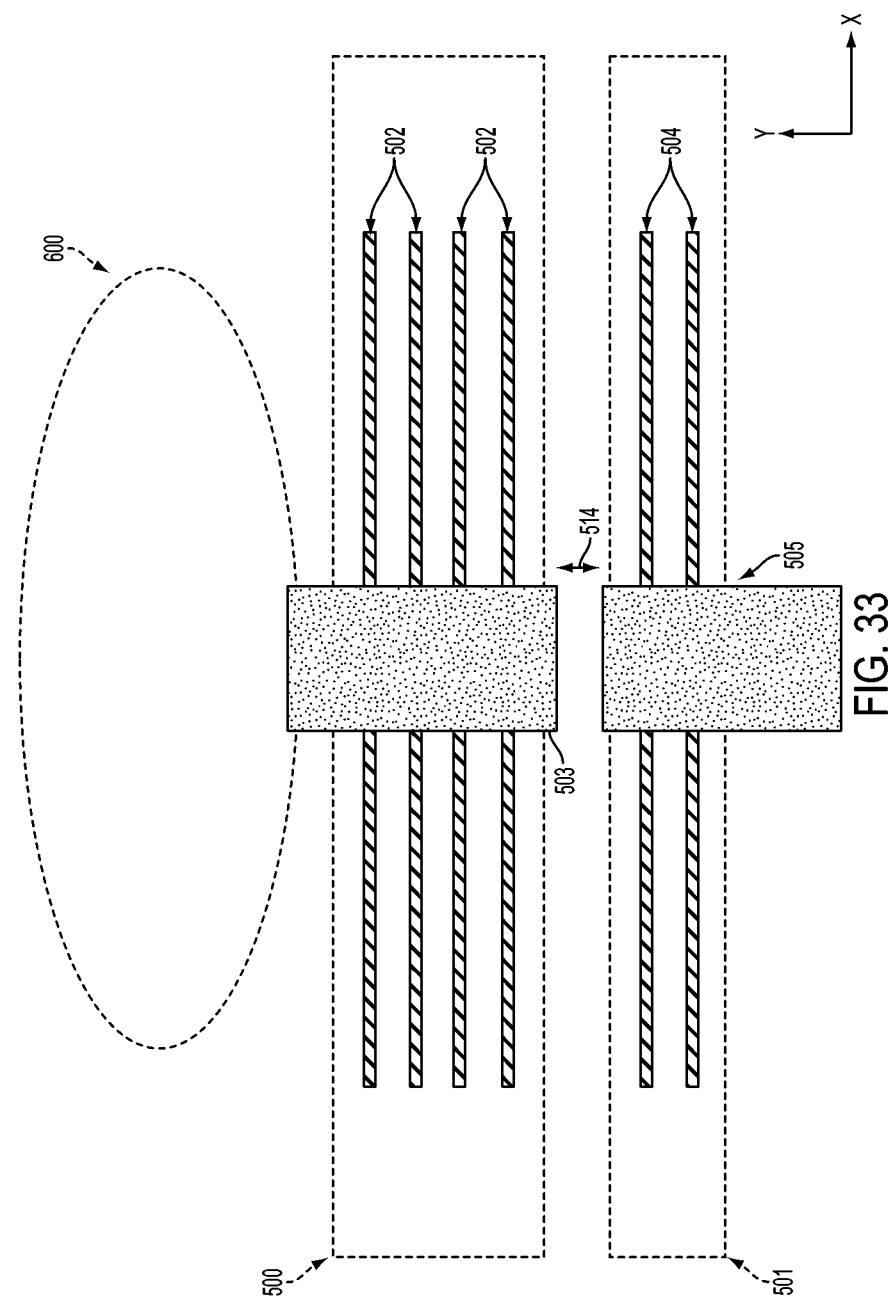

Turning now to FIGS. 31-33, a series of views illustrates masking patterns for forming patterning assist features according to a non-limiting embodiment of the invention. Referring to FIG. 31, a top view of two semiconductor devices 500 and 501 are illustrated. An active semiconductor region of the first device 500 is formed by crossing a first set of fins 502 and a second set of fins 504 with a single gate conductor 510.

The active fin regions are formed in response to patterning an extended portion of fins 506 and 507. One or more masking layers 508 are formed on the respective fins 502, 504 and one or more cutting patterns 509 are formed on the masking layer 508. In this manner, the fins 502, 504 covered by the cutting pattern 509 are removed, while the extended portion of the fins 506, 507 and the fins 502, 504 covered by the masking layer 508 are preserved and protected by masking layer 508 during the fin cutting process. In other words, only the portions of the fins 502, 504 covered by only the masking layer 508 will be protected during the fin cutting process while regions covered by the cutting pattern 509 or not covered by the masking pattern 508 will be removed.

Referring now to FIG. 32, various cut masks used to in conjunction with a cutting process are shown. According to a non-limiting embodiment, a first cut mask 511 is formed on the single gate structure 510 and between first semiconductor devices 500 and second semiconductor devices 501. A second cut mask 513 is formed at the gate extension area 600 and covers the extended portion 512 of the single gate structure 510.

Turning to FIG. 33, the first and second semiconductor device 500, 501 are shown following a multi-mask cutting process. Accordingly, the single gate structure 510 is cut such to form a first individual gate conductor 503 and a second individual gate conductors 505. Further, a minimum line-end spacing 514 is formed between the individual gate conductors 503 and 505, which is a critical design parameter that achieves high pattern density. In this manner, the line-end spacing 514 may be set smaller than what can be achieved with a single exposure. Since the line-end cut has adequate room for patterning, no cut mask may be required to form the patterned line end. Alternatively, a line-end cut may be employed to reduce the extension of the second gate conductor 503, for example, beyond the fins 502 and into the open gate extension area 600 as shown in FIG. 32. Following completion of the cutting process, a final semiconductor device is formed based on the various cutting masks. According to a non-limiting embodiment, the extended portion 512 of the first gate conductor 503 is cut away and does not occupy the gate extension area 600 as shown in FIG. 33.

Figure 34:
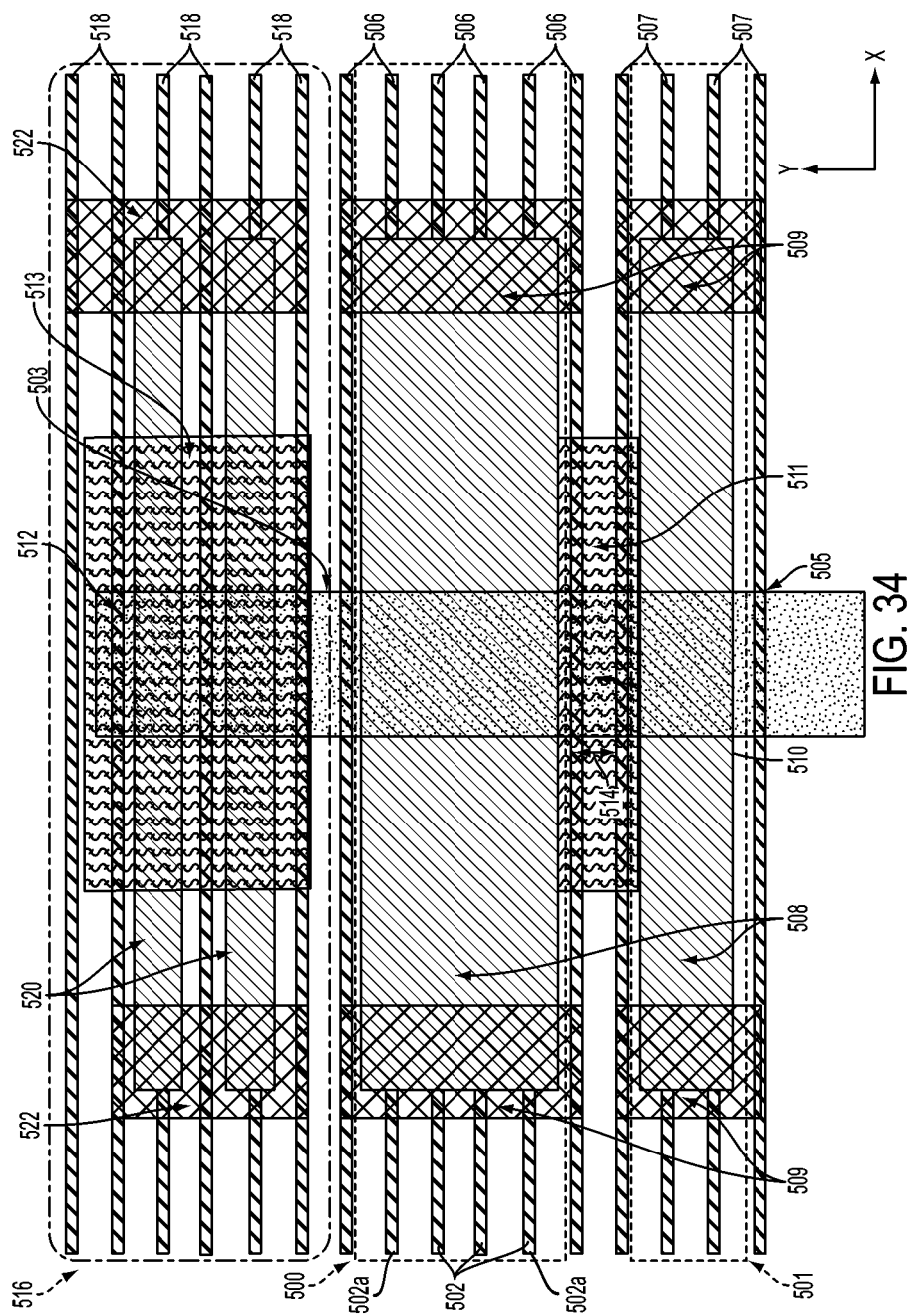

According to another non-limiting embodiment illustrated in FIG. 34, an additional semiconductor assist structure 516 is formed adjacent to one or more isolated fins 502a. The semiconductor assist structure 515 is configured to reduce tapering (i.e., the loading effect) realized by a respective isolated fin 502a, for example. According to an embodiment, the semiconductor assist structure 516 is created by modifying one or more layers. In this example, additional fins 518 are formed and then trimmed using masking patterns 520, and cutting patterns 522. As with previous embodiments, the process-induced size variation of masking layer 508 and cutting pattern 509 is reduced through the introduction of masking patterns 520 and cutting patterns 522.

In addition, if the gate conductor cutting pattern 513 is not employed in the original patterning methodology, such as depicted in FIG. 31, then the gate conductor cutting pattern 513 may be added at this stage to ensure that the newly created semiconductor assist structure 516 remains electrically inactive. On the other hand, if gate conductor cutting pattern 513 is already incorporated in the original patterning methodology, as depicted in FIG. 32, then no additional patterns are necessary to ensure the newly created semiconductor assist structure 516 remains electrically inactive.

Figure 35:
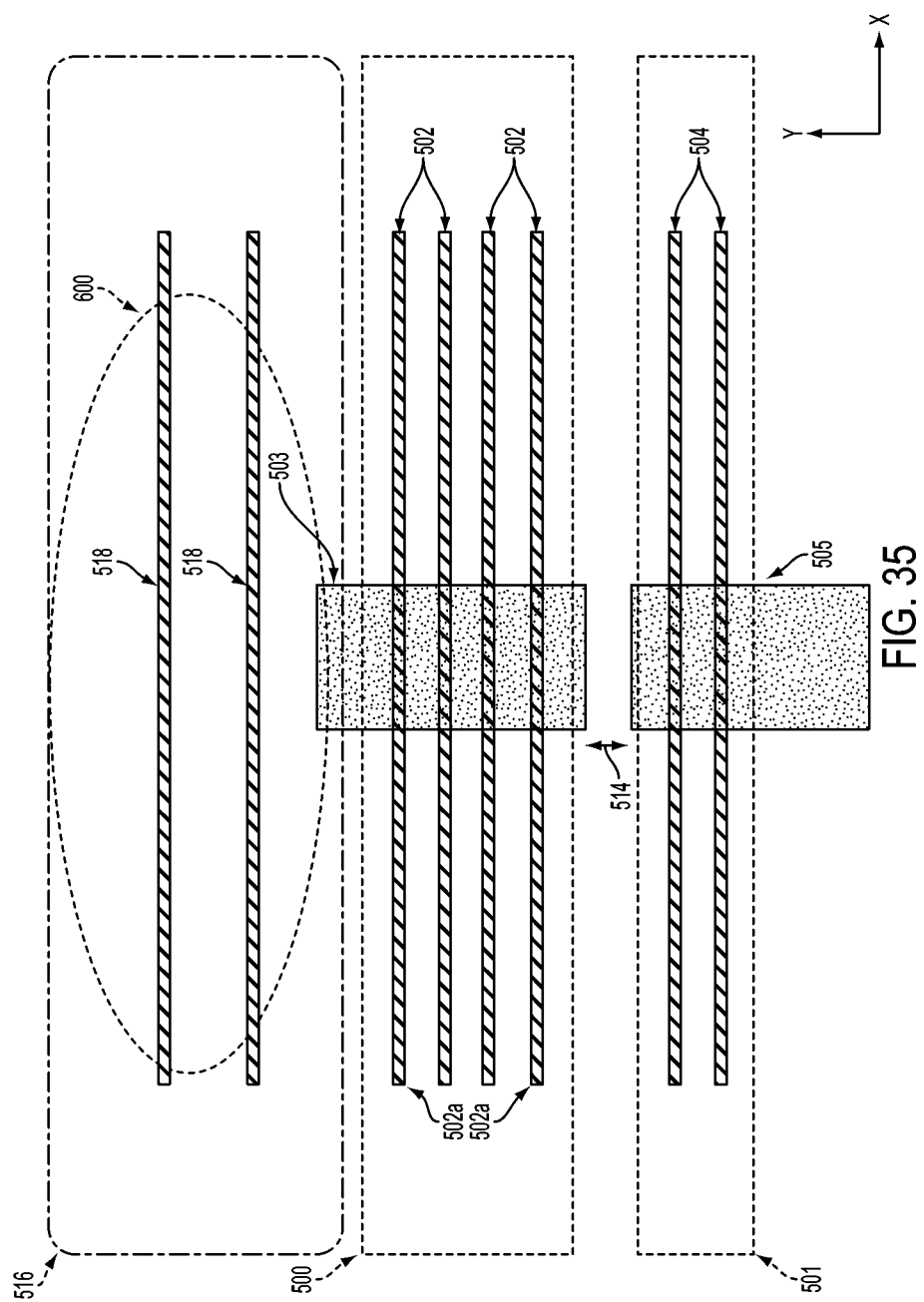
FIG. 35 is a final semiconductor device that maintains a portion of the additional semiconductor assist structure illustrated in FIG. 34 following completion of the fabrication process.

Referring to FIG. 35, a final semiconductor device is illustrated following the gate conductor cutting process that forms the first and second gate conductors 503 and 505, respectively. Accordingly, at least a portion of the additional semiconductor assist structure 516 is maintained in a gate extension area 600 that is traditionally occupied with, for example, a portion of the gate conductor 503.

The terminology used herein is for the purpose of describing exemplary embodiments only and is not intended to be limiting of the teachings. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The flow diagrams depicted herein are just one example. There may be many variations to this diagram or operations described therein without departing from the spirit of the teachings. For instance, the operations may be performed in a differing order or operations may be added, deleted or modified. All of these variations are considered a part of the claimed teachings.

While exemplary embodiments of the present disclosure have been described, it will be understood that those skilled in the art, both now and in the future, may make various changes the teachings which fall within the scope of the claims described below.

The invention claimed is:

1. A method of fabricating a semiconductor device, the method comprising:
   forming a masking layer on an upper surface of a semiconductor substrate;
   patterning the masking layer to form at least one masking element that designates an active region of the semiconductor substrate and at least one patterning assist feature adjacent the at least one masking element; and
   performing an etching process to form a plurality of semiconductor fins on the semiconductor substrate, the plurality of semiconductor fins including at least one isolated fin formed on the active region according to the at least one masking element and at least one sacrificial fin formed according to the at least one patterning assist feature that reduces a loading effect that occurs during the etching process,
      wherein the etching process is a reactive ion etching (RIE) process, and wherein the at least one patterning assist feature realizes diffusion of reactive neutral species generated by the RIE process such that passivation to the sidewalls of the at least one isolated fin is reduced.

2. The method of claim 1, further comprising:
   after performing the etching process, forming at least one first cut mask on the upper surface of the semiconductor substrate to cover at least one portion of the at least one isolated fin while exposing the at least one sacrificial fin; and
   performing a sacrificial etching process to remove the at least one sacrificial fin while maintaining the at least one isolated fin.

3. The method of claim 2, wherein the sacrificial etching process removes exposed portions of the at least one isolated fin.

4. The method of claim 3, wherein the at least one patterning assist feature is arranged according to a feature patterning table.

5. The method of claim 4, wherein the feature patterning table is based on a distance between the at least one patterning assist feature and the at least one isolated fin.

6. The method of claim 5, wherein the feature patterning table is based further on at least one of a number of the at least one patterning assist feature, and a width of the at least one patterning assist feature.

7. The method of claim 3, wherein the at least one patterning assist feature is arranged according to an etching model.

8. The method of claim 7, wherein the etching model is based on lithographic exposure patterns and a resist exposure and development characteristics of the masking layer.

9. A method of fabricating a semiconductor device, the method comprising:
   forming a plurality of semiconductor fins on an upper surface of a semiconductor substrate, the plurality of fins including at least one isolated fin and at least one sacrificial fin;
   forming a cut mask on the upper surface of the semiconductor substrate to cover the plurality of fins, and patterning the cut mask to expose the at least one sacrificial fin;
   performing a first sacrificial cutting process to remove the at least one sacrificial fin and form a void on the upper surface of the substrate while maintaining the at least one isolated fin;
   forming a patterning assist feature in the void such that the combination of the patterning assist feature and the at least one isolated fins defines a dense array pattern; and
   performing an etching process to transfer the dense array pattern into the semiconductor substrate, the at least one patterning assist feature reducing the loading effect realized by the at least one isolated fin during the etching process.

10. The method of claim 9, wherein the etching process is a reactive ion etching (RIE) process, and wherein the patterning assist feature realizes diffusion of reactive neutral species generated by the RIE process such that passivation to the sidewalls of the at least one isolated fin is reduced.

11. The method of claim 10, wherein the cut mask exposes a portion of the at least one isolated fin, and the first sacrificial cutting process removes the exposed portion of the at least one isolated fin.

12. The method of claim 11, further comprising performing a second sacrificial cutting process that removes the at least one-patterning assist feature to define an isolated semiconductor device including only the at least one isolated fin.

13. The method of claim 12, wherein the printing patterning assist feature is arranged according to a feature patterning table.

14. The method of claim 13, wherein the feature patterning table is based on at least one of a distance between the patterning assist feature and the at least one isolated fin, a number of the patterning assist feature, and a width of the at least one-patterning assist feature.

15. The method of claim 12, wherein the patterning assist feature is arranged according to an etching model.

16. The method of claim 15, wherein the etching model is based on lithographic exposure patterns and a resist exposure and development characteristics of masking layer.

17. A method of fabricating a semiconductor device, the method comprising:
   forming a plurality of semiconductor fins on an upper surface of a semiconductor substrate, the plurality of fins extending along a first direction to define a length;

forming a gate stack on the plurality of semiconductor fins, the gate stack extending in the first direction to define a gate length and a second distance opposite the first direction to define a gate width;

identifying a gate extension portion located adjacent the plurality of semiconductor fins to receive an extended portion of the gate stack; and forming a cutting pattern in the gate extension portion and on the extend portion of the gate stack; and forming a semiconductor assist structure adjacent an isolated semiconductor included with the plurality of semiconductor fins.

18. The method of claim 17, wherein the gate extension portion is removed according to the cutting pattern prior to forming the semiconductor assist structure.

19. The method of claim 18, further comprising forming at least one cutting pattern on the plurality of semiconductor fins and at least one masking layer on the plurality of semiconductor fins, and etching the plurality of semiconductor fins according to the at least one cutting pattern and the at least one masking layer.

* * * * *